United States Patent
Suzuki

(10) Patent No.: US 7,511,555 B2
(45) Date of Patent: Mar. 31, 2009

(54) LEVEL CONVERSION CIRCUIT AND INPUT-OUTPUT DEVICE USING SAME

(75) Inventor: Toshio Suzuki, Kanagawa (JP)

(73) Assignee: Sony Corporation (JP)

( * ) Notice: Subject to any disclaimer, the term of this patent is extended or adjusted under 35 U.S.C. 154(b) by 205 days.

(21) Appl. No.: 11/790,335

(22) Filed: Apr. 25, 2007

(65) Prior Publication Data

US 2007/0257724 A1      Nov. 8, 2007

(30) Foreign Application Priority Data

May 8, 2006    (JP) .............................. 2006-129100

(51) Int. Cl.
*H03L 5/00* (2006.01)
(52) U.S. Cl. ........................... 327/333; 326/81
(58) Field of Classification Search ................. 327/333; 326/62, 63, 68, 80, 81
See application file for complete search history.

(56) References Cited

U.S. PATENT DOCUMENTS

| | | | | |
|---|---|---|---|---|
| 5,191,233 A * | 3/1993 | Nakano | ....................... | 327/333 |
| 6,480,051 B2 * | 11/2002 | Drapkin et al. | ............. | 327/333 |
| 6,498,509 B2 * | 12/2002 | Fournel | ........................ | 326/37 |
| 6,563,372 B1 * | 5/2003 | Fournel | ....................... | 327/543 |
| 6,614,283 B1 * | 9/2003 | Wright et al. | ............... | 327/333 |
| 6,788,125 B1 * | 9/2004 | Tomsio | ........................ | 327/333 |
| 7,176,740 B2 * | 2/2007 | Tachibana et al. | ........... | 327/333 |
| 7,176,741 B2 * | 2/2007 | Ishikawa et al. | ............. | 327/333 |
| 7,295,056 B2 * | 11/2007 | Tanaka et al. | ............... | 327/333 |
| 2004/0140842 A1 * | 7/2004 | Lee et al. | ..................... | 327/333 |
| 2006/0103422 A1 * | 5/2006 | Richardson | .................. | 326/80 |

FOREIGN PATENT DOCUMENTS

| | | |
|---|---|---|
| JP | 2005-064952 | 3/2005 |
| JP | 2005-311712 | 11/2005 |
| JP | 2005-323195 | 11/2005 |
| JP | 2005-333595 | 12/2005 |

* cited by examiner

*Primary Examiner*—Lincoln Donovan
(74) *Attorney, Agent, or Firm*—Rader Fishman & Grauer PLLC; Ronald P. Kananen

(57) ABSTRACT

A level conversion circuit includes a controlling section supplied with a first power supply voltage and a second power supply voltage different from each other, the controlling section outputting a bias voltage, detecting rising of the first power supply voltage and the second power supply voltage, and outputting a control signal corresponding to a period from the rising of a power supply voltage to stabilization of the power supply voltage, and a level converting section supplied with the control signal and the bias voltage, operation of the level converting section being set in one of a shutdown state and a normal operation state according to the control signal, and the level converting section converting level of an input signal and outputting a signal different in level from the input signal when the operation of the level converting section is set in the normal operation state.

15 Claims, 14 Drawing Sheets

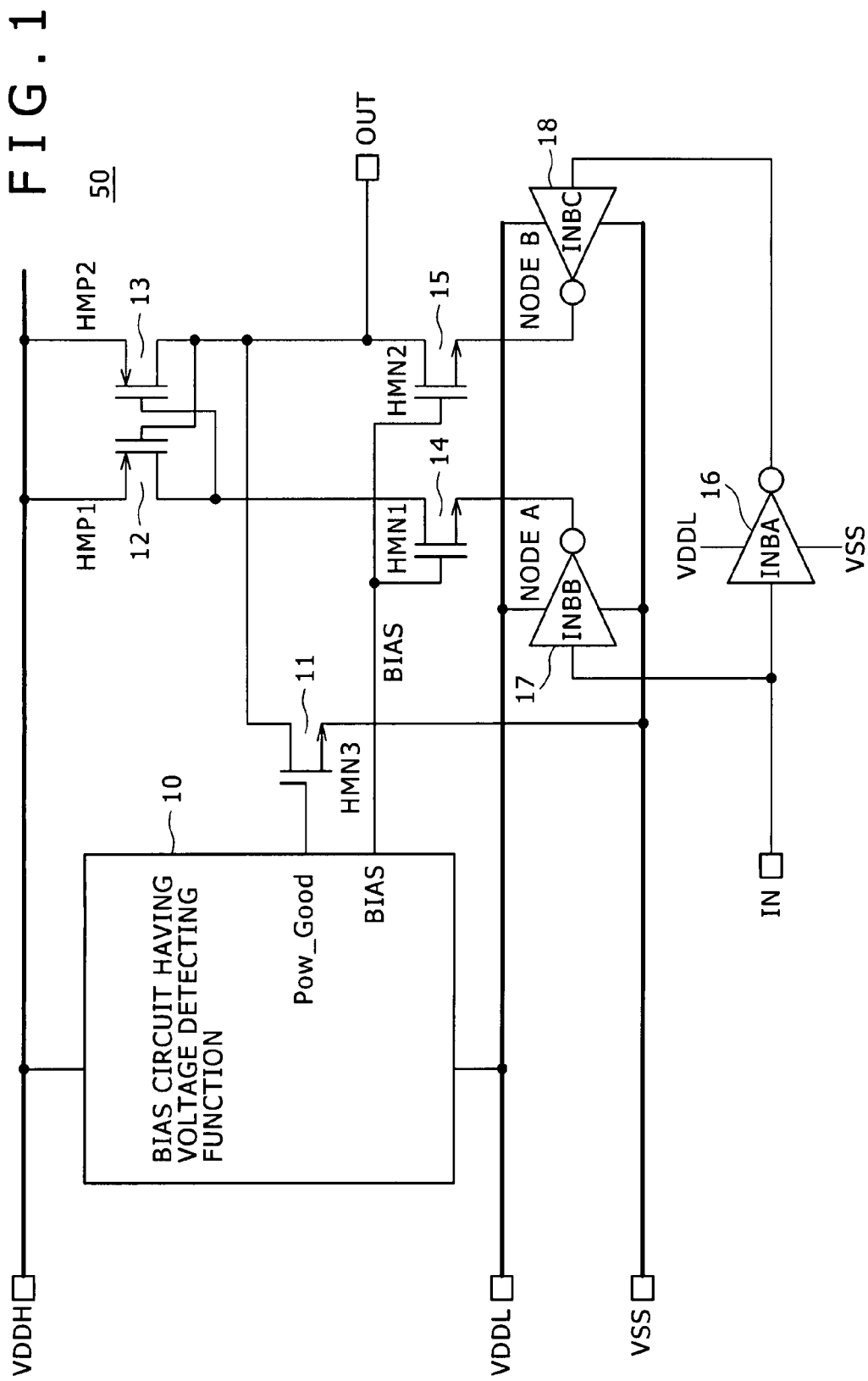

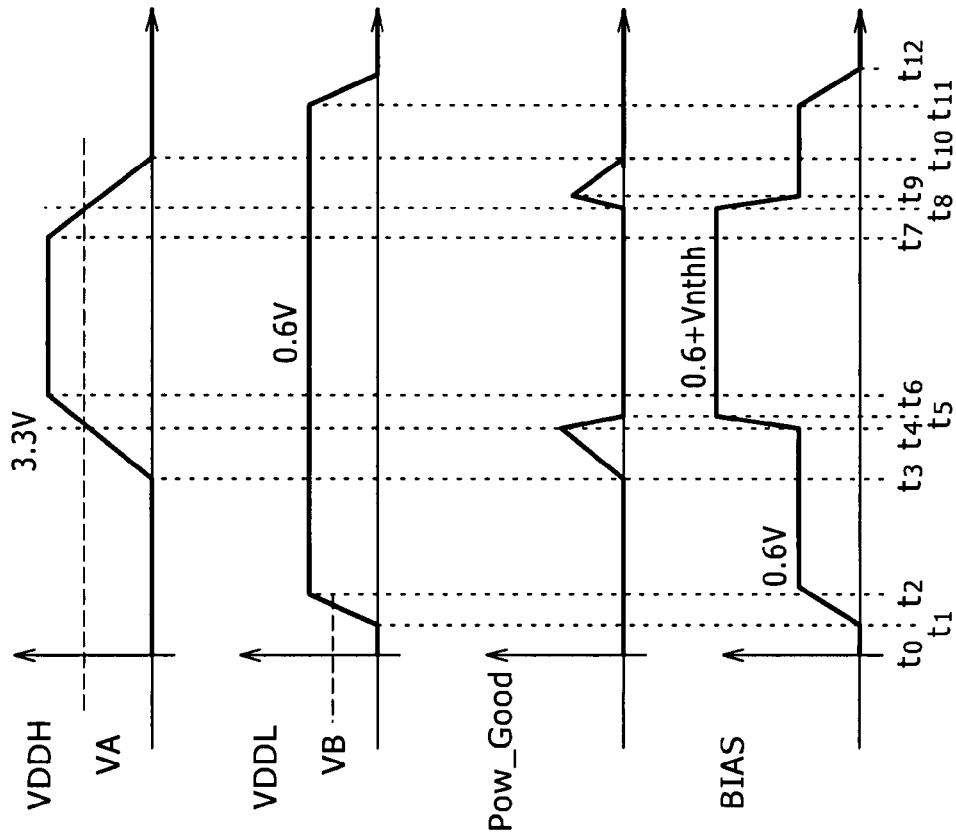
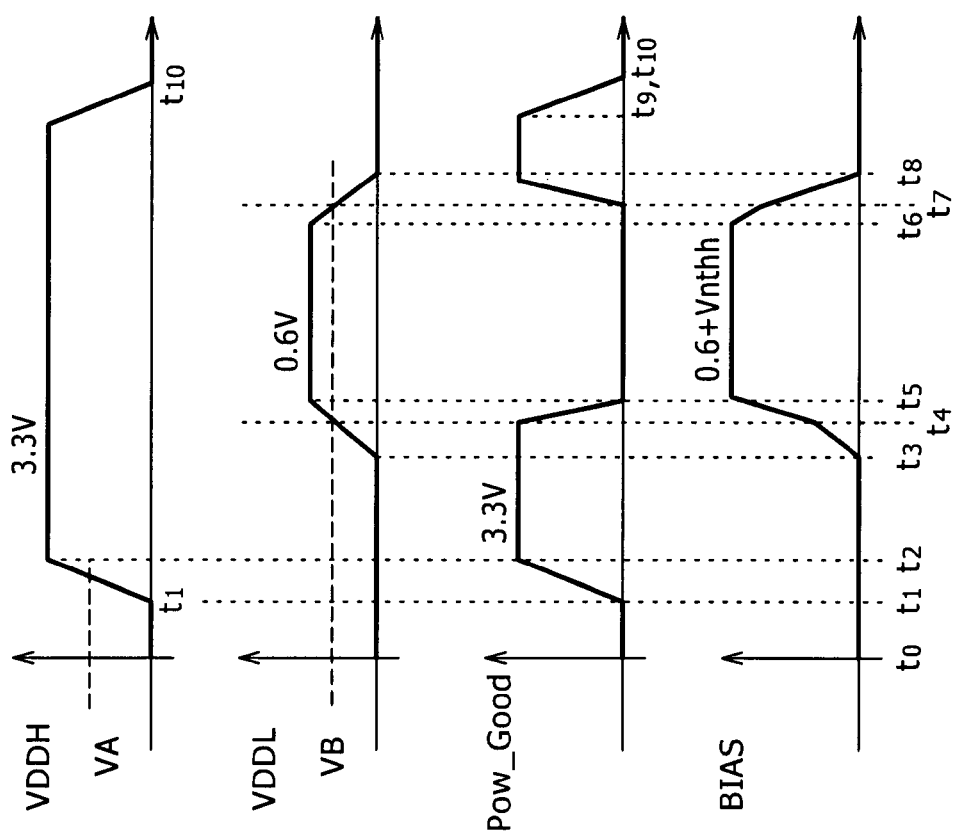
FIG. 2A
FIG. 2B

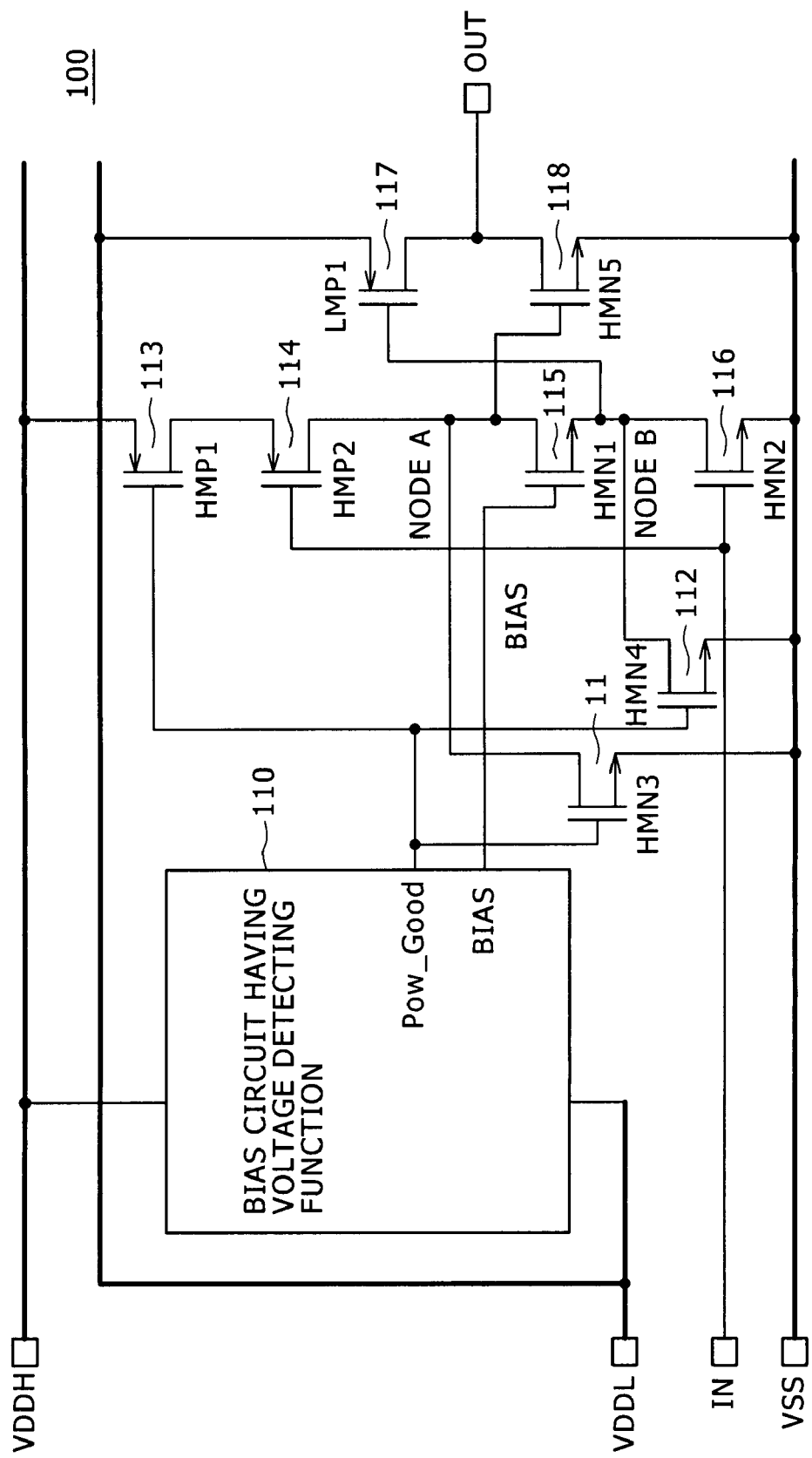

LEVEL CONVERSION CIRCUIT AND INPUT-OUTPUT DEVICE USING SAME

CROSS REFERENCES TO RELATED APPLICATIONS

The present invention contains subject matter related to Japanese Patent Application JP 2006-129100 filed with the Japan Patent Office on May 8, 2006, the entire contents of which being incorporated herein by reference.

BACKGROUND OF THE INVENTION

1. Field of the Invention

The present invention relates to a level conversion circuit for converting an input pulse to a high-voltage or low-voltage pulse according to the level of operating voltage of a logical circuit connected in a subsequent stage, and an input-output device using the level conversion circuit.

2. Description of the Related Art

FIG. 9 shows an existing voltage raising type level conversion circuit 400. While this level conversion circuit 400 is used commonly and widely, the level conversion circuit 400 causes indeterminate operation at a starting time of power supply voltage. In addition, because high breakdown voltage MOS (Metal Oxide Semiconductor) transistors HMN1 (401), HMN2 (402), HMP1 (403), and HMP2 (404) are used as shown in FIG. 9, the level conversion circuit 400 may not be operated with a power supply voltage lower than the threshold value of a high breakdown voltage N (N-channel) MOS transistor.

As means for solving the former problem, a level conversion circuit 450 shown in FIG. 10, for example, is disclosed in Japanese Patent Laid-Open No. 2005-323195 referred to as Patent Document 1 hereinafter. In this method, however, a latch circuit formed by an inverter 453 and a NAND circuit 454 is operated by a power-on reset signal (POR). Thus, an initial value can be determined, and the problem of a power supply sequence is remedied. However, because the circuit is formed by high breakdown voltage MOS transistors alone, operation with low power supply voltage may not be performed. In addition, the latter problem still remains. Further, because high breakdown voltage MOS transistors generally have a slow operating speed, higher speed may not be achieved easily.

As means for solving the latter problem, a level conversion circuit 500 shown in FIG. 11, for example, is disclosed in Japanese Patent Laid-Open No. 2005-311712 referred to as Patent Document 2 hereinafter. This method enables power supply voltage to be lowered, but is not ready for a free power supply sequence. In addition, because the level conversion circuit (500) itself does not have a circuit for setting an initial value, a value at a starting time is undetermined. Further, because bias (BIAS) voltage starts quickly, in a case where a low voltage power supply VDDL starts slowly after a high voltage power supply VDDH starts, the level conversion circuit operates while an input signal remains undetermined, so that erroneous operation occurs.

FIG. 12 shows a voltage lowering type level conversion circuit. As shown in FIG. 12, in this circuit, inverters are formed simply by high breakdown voltage MOS transistors, and therefore operation may not be performed with a low power supply voltage VDDL lower than the threshold value of the high breakdown voltage MOS transistors. As means for solving this problem, a voltage lowering type level conversion circuit 600 as shown in FIG. 13, for example, is disclosed in Japanese Patent Laid-Open No. 2005-64952 referred to as Patent Document 3 hereinafter. This method makes it possible to lower the voltage of the low voltage power supply VDDL, but has a disadvantage of consumption of a DC current because voltage division is performed by resistances R1 (603) and R2 (604) as shown in FIG. 13 or a diode connection of a MOS transistor not shown in the figure. In addition, when the resistance values of the resistances R1 (603) and R2 (604) are increased and the DC current is decreased, operating speed becomes slow.

As another existing technique, a level conversion circuit 650 shown in FIG. 14 is disclosed in Japanese Patent Laid-Open No. 2005-333595 referred to as Patent Document 4 hereinafter. In the circuit of FIG. 14, a PMOS transistor side is changed to low breakdown voltage MOS transistors LMP1 (652) and LMP2 (653), so that operation can be performed with a low power supply voltage VDDL lower than the threshold value of a high breakdown voltage MOS transistor. However, because the cross-coupled PMOS transistors LMP1 (652) and LMP2 (653) are inverted, there is a problem of an increase in current in a transient state, and there is a disadvantage of provision being not made for a free power supply sequence.

SUMMARY OF THE INVENTION

As described above, the existing level conversion circuits of the voltage raising type and the voltage lowering type both have problems.

Further, in the past, the latch type level conversion circuit as shown in FIG. 9 is generally used, but has problems in that, for example, operation is not performed with low power supply voltage, a through current flows at a starting time, and output becomes undetermined.

While various efforts have been made to deal with these problems, none of the efforts can solve the problems in terms of the lowering of power supply voltage, a free power supply sequence, and the like.

It is desirable to solve all of these problems at the same time with a simple circuit configuration.

It is also desirable to provide a level conversion circuit that determines an initial value without producing undetermined output irrespective of order of starting of multiple power supplies and the slopes of power supply voltages (free power supply sequence), can perform high-speed operation even from a low power supply voltage lower than the threshold value of a high breakdown voltage MOS transistor, and is operated with a substantially zero DC current in a steady state.

According to an embodiment of the present invention, there is provided a level conversion circuit including: a controlling section supplied with a first power supply voltage and a second power supply voltage different from each other, the controlling section outputting a bias voltage, detecting rising of the first power supply voltage and the second power supply voltage, and outputting a control signal corresponding to a period from the rising of a power supply voltage to stabilization of the power supply voltage; and a level converting section supplied with the control signal and the bias voltage, operation of the level converting section being set in one of a shutdown state and a normal operation state according to the control signal, and the level converting section converting level of an input signal and outputting a signal different in level from the input signal when the operation of the level converting section is set in the normal operation state.

According to an embodiment of the present invention, there is provided a level conversion circuit including: a controlling section supplied with a first power supply voltage and a second power supply voltage different from each other, the controlling section outputting a bias voltage, detecting rising of the first power supply voltage and the second power supply voltage, and outputting a control signal corresponding to a period from the rising of a power supply voltage to stabilization of the power supply voltage; a level converting section supplied with one of the first power supply voltage and the second power supply voltage, the level converting section converting level of an input signal and outputting an output signal of a voltage different in level from the input signal when the level converting section is in a normal operating state; and an operation controlling section supplied with the control signal and connected in series with or in parallel with the level converting section, the operation controlling section controlling the level converting section so as to set operation of the level converting section in one of a shutdown state and an operating state according to the control signal.

According to an embodiment of the present invention, there is provided an input-output device including: a controlling section supplied with a first power supply voltage and a second power supply voltage, the controlling section outputting a bias voltage, detecting rising of the first power supply voltage and the second power supply voltage at a starting time, and outputting a control signal for a period until the first power supply voltage and the second power supply voltage are stabilized; at least one first level conversion circuit supplied with the control signal and the bias voltage from the controlling section, level converting operation of the first level conversion circuit being shut down for the period until the first power supply voltage and the second power supply voltage are stabilized, and the first level conversion circuit performing conversion from a first signal level to a second signal level when the first power supply voltage and the second power supply voltage are stabilized; and at least one second level conversion circuit supplied with the control signal and the bias voltage from the controlling section, level converting operation of the second level conversion circuit being shut down for the period until the first power supply voltage and the second power supply voltage are stabilized, and the second level conversion circuit performing conversion from the second signal level to the first signal level when the first power supply voltage and the second power supply voltage are stabilized.

Rising voltages at times of starting of a high voltage power supply and a low voltage power supply are detected, the level conversion circuit is shut down until the high voltage power supply and the low voltage power supply are stabilized, and level conversion is performed after the power supply voltages are stabilized, whereby a free power supply sequence, lower power supply voltage, and high-speed operation can be achieved.

BRIEF DESCRIPTION OF THE DRAWINGS

FIG. 1 shows a circuit configuration of a level conversion circuit according to a first embodiment;

FIGS. 2A and 2B are waveform charts of assistance in explaining the operation of a bias circuit having a voltage detecting function in the level conversion circuit of FIG. 1;

FIG. 3 shows a circuit configuration of a level conversion circuit according to a second embodiment;

DETAILED DESCRIPTION OF THE PREFERRED EMBODIMENTS

Figure 4:
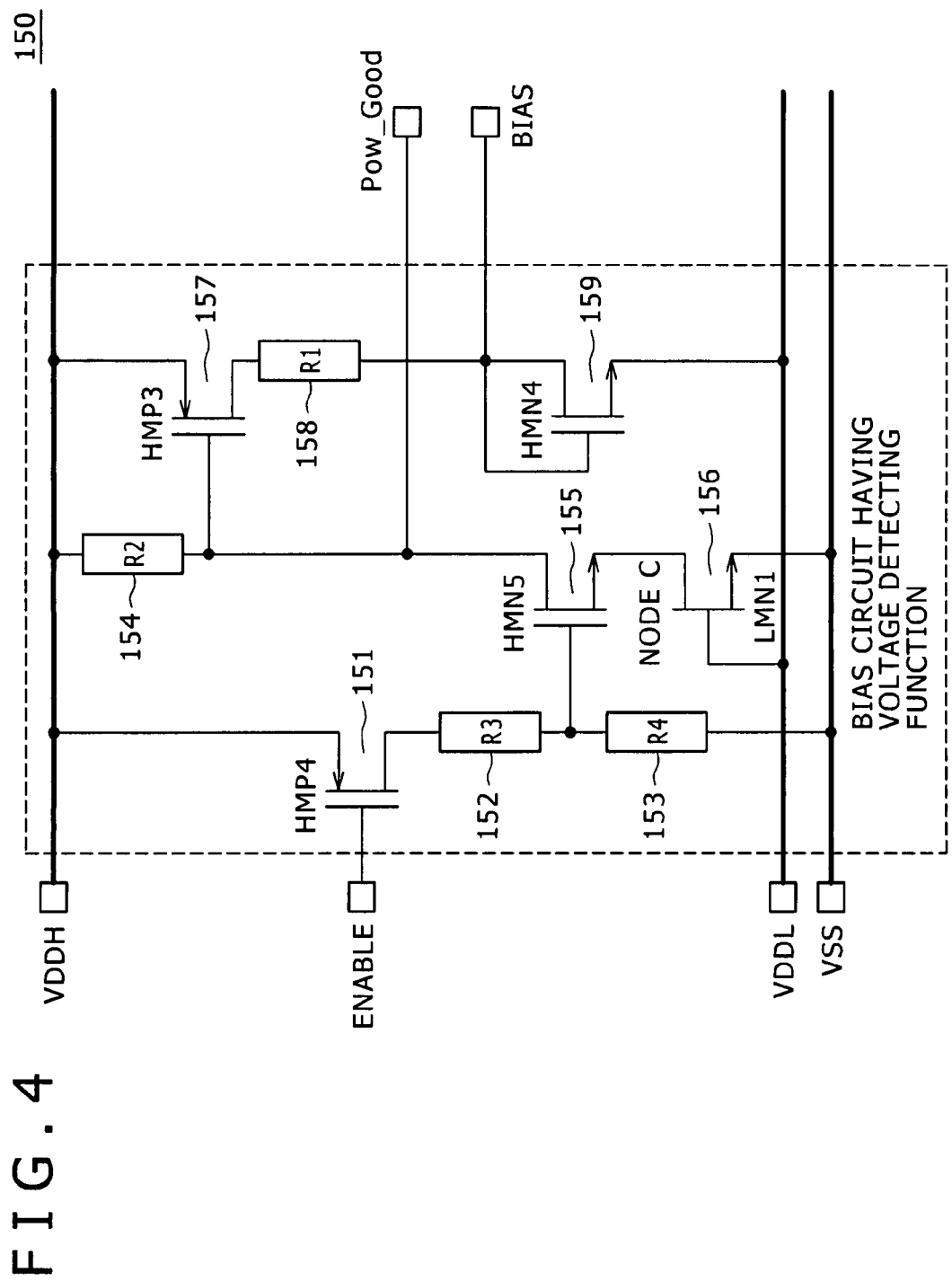
FIG. 4 shows a circuit configuration of a bias circuit having a voltage detecting function according to a third embodiment, which circuit is included in the level conversion circuits shown in FIG. 1 and FIG. 3.

FIG. 1 is a diagram of configuration of a voltage raising type level conversion circuit 50 according to a first embodiment of the present invention.

The level conversion circuit 50 includes: a pair of cross-coupled high breakdown voltage PMOS transistors HMP1 (12) and HMP2 (13); two cascaded high breakdown voltage NMOS transistors HMN1 (14) and HMN2 (15); three inverters INBA (16), INBB (17), and INBC (18) formed by a low breakdown voltage CMOS transistor; one initial value setting NMOS transistor (HMN3 (11)); and a bias (BIAS) circuit 10 having a voltage detecting (Detector) function.

A configuration of circuit connection of the level conversion circuit 50 will next be described. The bias circuit 10 having the voltage detecting function has terminals connected to a high voltage power supply VDDH and a low voltage power supply VDDL. The bias circuit 10 having the voltage detecting function outputs a control signal from a power supply voltage detecting (hereinafter described as POW_GOOD) terminal and outputs a bias voltage from a bias (BIAS) terminal.

The POW_GOOD terminal is connected to the gate of the transistor HMN3 (11). The drain of the transistor HMN3 (11) is connected to the drain of the transistor HMP2 (13), the gate of the transistor HMP1 (12), and an output terminal OUT. The source of the transistor HMN3 (11) is connected to a reference voltage power supply VSS. The bias (BIAS) terminal is connected to the gates of the transistors HMN1 (14) and HMN2 (15). The drain of the transistor HMN1 (14) is connected to the drain of the transistor HMP1 (12) and the gate of the transistor HMP2 (13). The source of the transistor HMN1 (14) is connected to the output of the inverter INBB (17).

The drain of the transistor HMN2 (15) is connected to the drain of the transistor HMP2 (13) and the gate of the transistor HMP1 (12). The source of the transistor HMN2 (15) is connected to the output of the inverter INBC (18). The source of the transistor HMP1 (12) and the source of the transistor HMP2 (13) are connected to the high voltage power supply VDDH.

An input terminal IN is connected to the inputs of the inverters INBA (16) and INBB (17) formed by low breakdown voltage MOS transistors. The output of the inverter INBB (17) is connected to the source of the transistor HMN1 (14). The output of the inverter INBA (16) is connected to the input of the inverter INBC (18) formed by low breakdown voltage MOS transistors. The output of the inverter INBC (18) is connected to the source of the transistor HMN2 (15). The inverters INBA (16), INBB (17), and INBC (18) are connected to the low voltage power supply VDDL and the reference voltage power supply VSS, so that the inverters INBA (16), INBB (17), and INBC (18) operate with low voltage.

Description will next be made of a bias (BIAS) voltage output from the bias terminal of the bias circuit 10 having the voltage detecting function.

The output value of the bias terminal when the bias circuit 10 having the voltage detecting function is operable (OK) is a voltage value expressed by the following equation.

[Equation 1]

$$\text{BIAS} = V_{DDL} + V\text{nthh} \quad (1)$$

where $V_{DDL}$ denotes the output voltage of the low voltage power supply VDDL, and Vnthh denotes the threshold voltage of a high breakdown voltage NMOS transistor.

When the bias circuit 10 having the voltage detecting function is not operable (OK), the following value is output.

[Equation 2]

$$\text{BIAS} = V_{DDL} \quad (2)$$

The bias circuit 10 having the voltage detector function detects whether all of the following conditions A and B as expressed by Equation 3 are satisfied.

[Equation 3]

$$\text{Condition A: } V_{DDH} > VA \quad (3)$$

$$\text{Condition B: } V_{DDL} > VB \quad (4)$$

where VA and VB are respectively minimum voltage values at which a high breakdown voltage CMOS transistor and a low breakdown voltage CMOS transistor operate.

When both the conditions A and B are satisfied, the POW_GOOD terminal is changed from a $V_{DDH}$ level to a $V_{SS}$ level, and the BIAS voltage given by Equation 1 is supplied.

In order to operate with the low voltage $V_{DDL}$ supplied from the low voltage power supply VDDL, the level conversion circuit 50 has the constitution of low breakdown voltage CMOS transistors at the input. In order to protect the CMOS transistors having a low breakdown voltage, a node (Node) A and a node (Node) B are respectively clamped to the source voltages of the cascaded NMOS transistors HMN1 (14) and HMN2 (15), that is, substantially the voltage value $V_{DDL}$ of the low voltage power supply VDDL. A voltage $V_{DDL}+V\text{nthh}$ is applied to the gates of the cascaded NMOS transistors HMN1 (14) and HMN2 (15).

Figure 11:
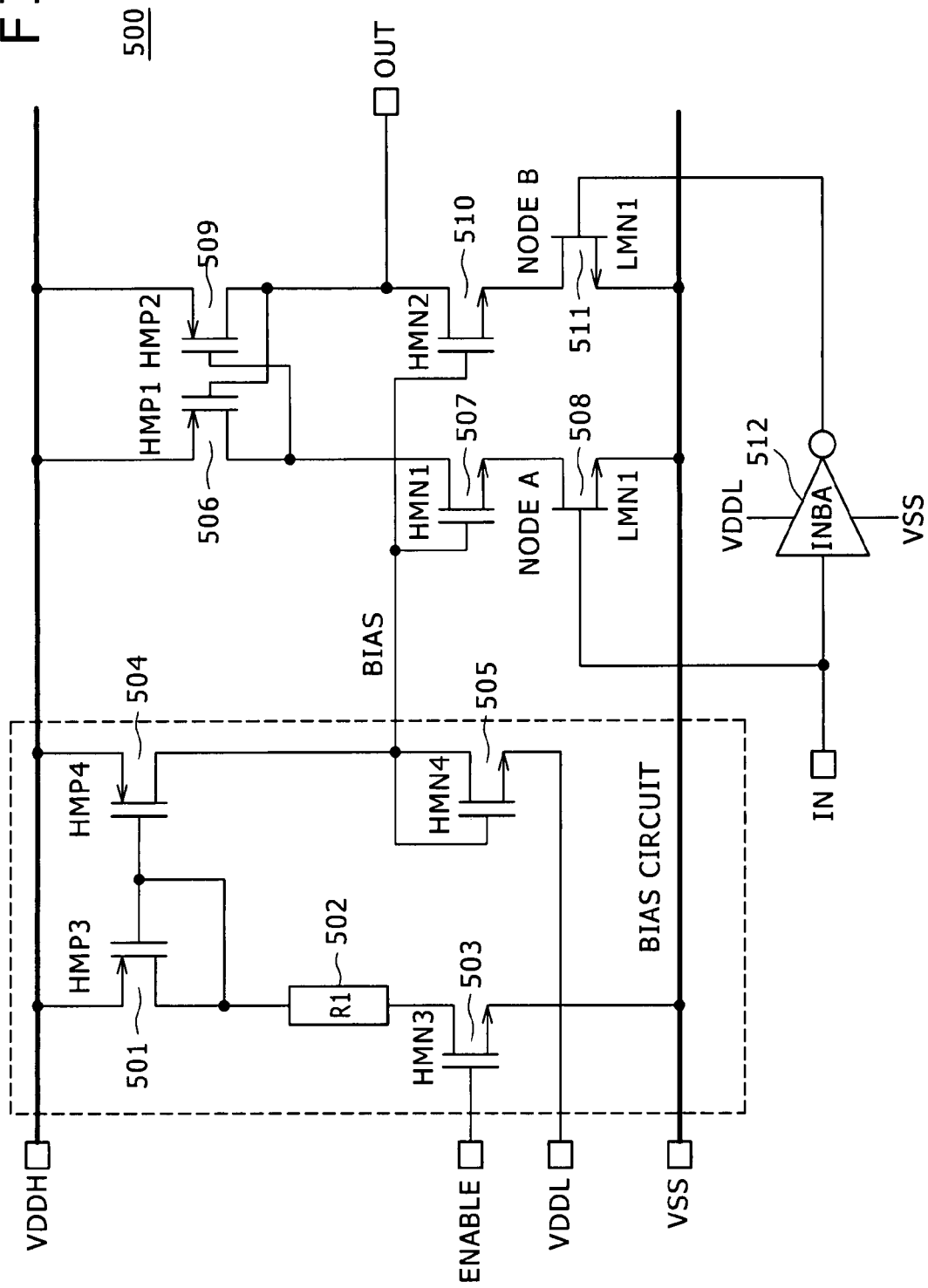
FIG. 11 shows a circuit configuration of a level conversion circuit according to a third existing example.
Figure 12:
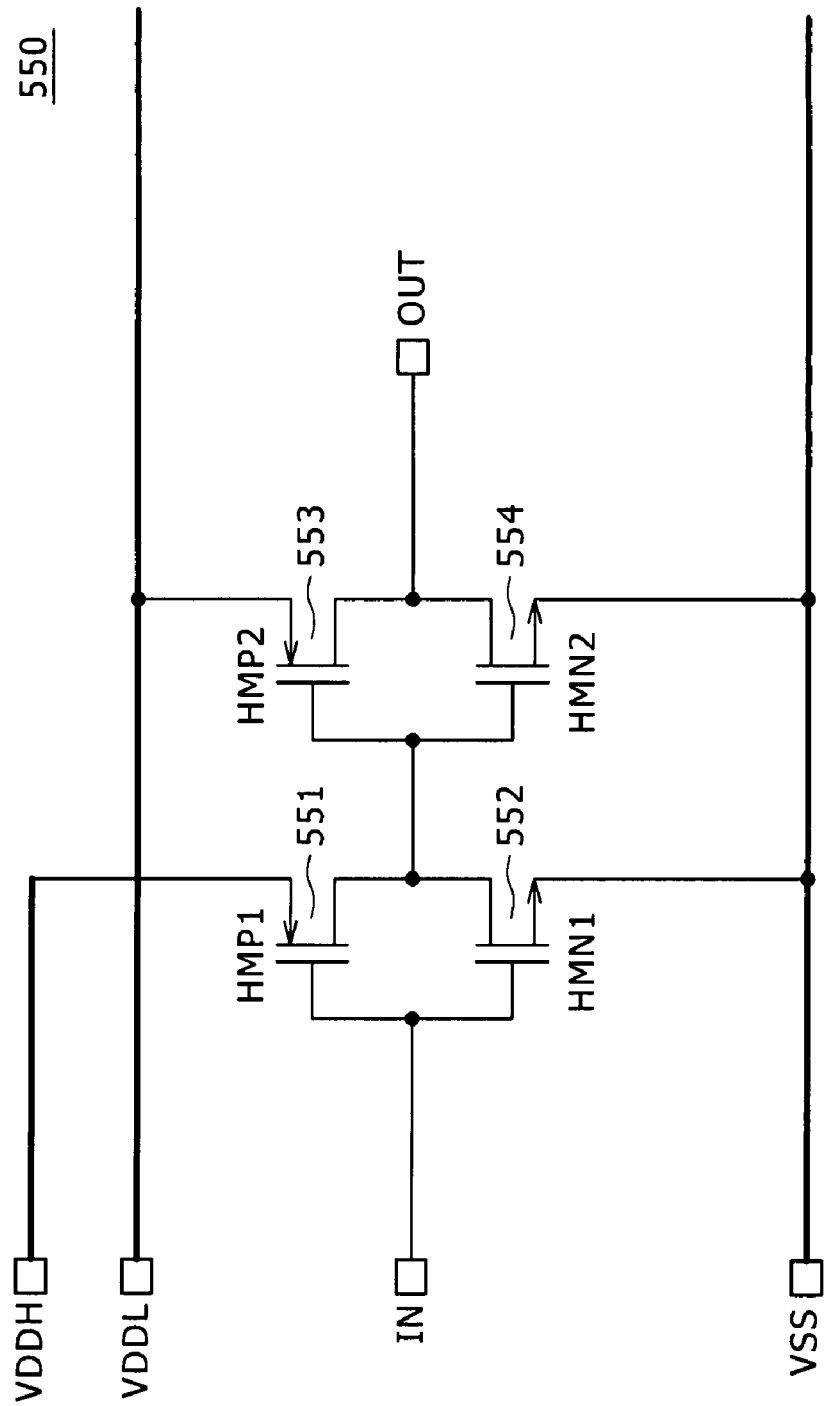
FIG. 12 shows a circuit configuration of a level conversion circuit according to a fourth existing example.
Figure 13:
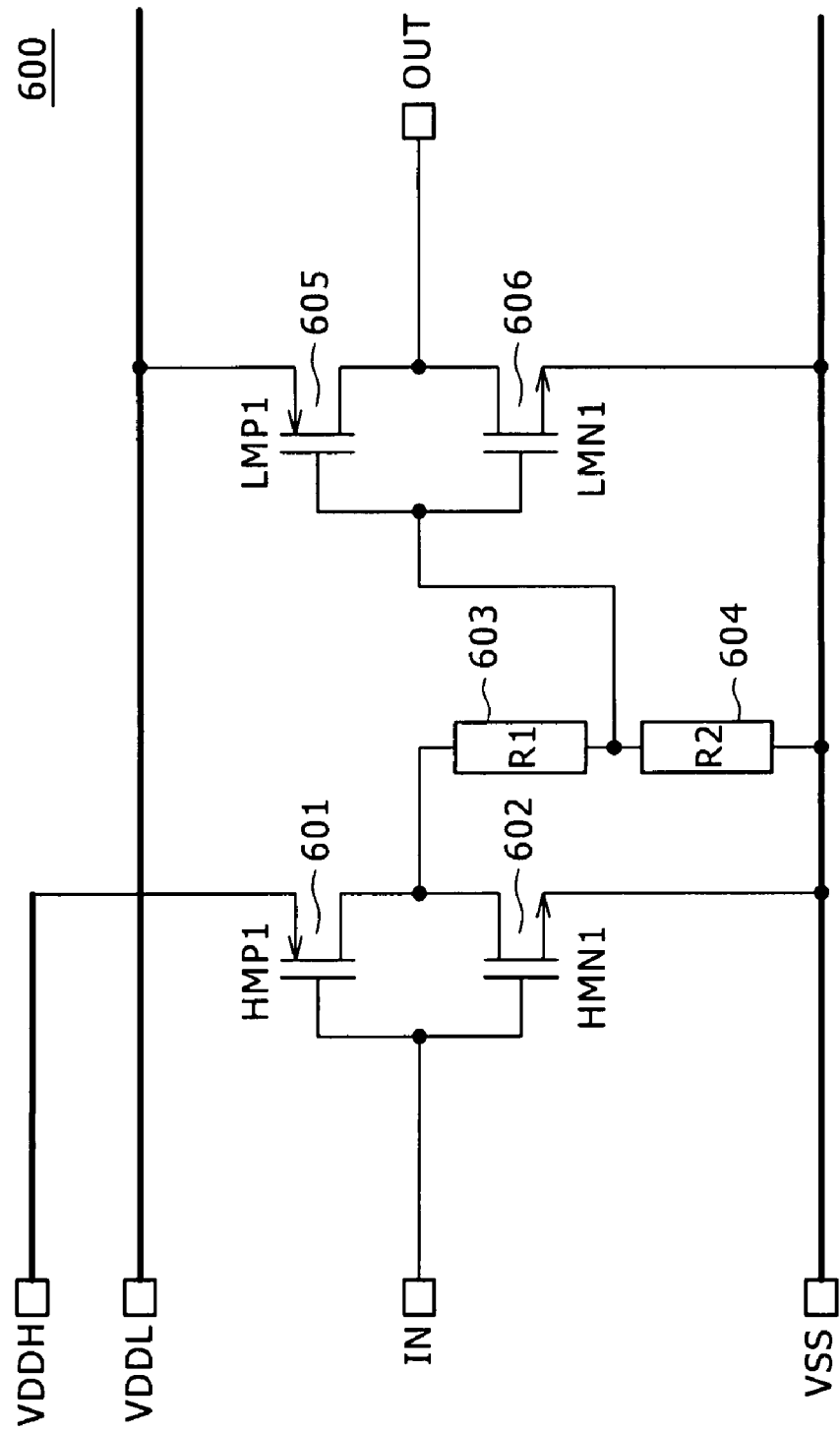
FIG. 13 shows a circuit configuration of a level conversion circuit according to a fifth existing example.
Figure 14:
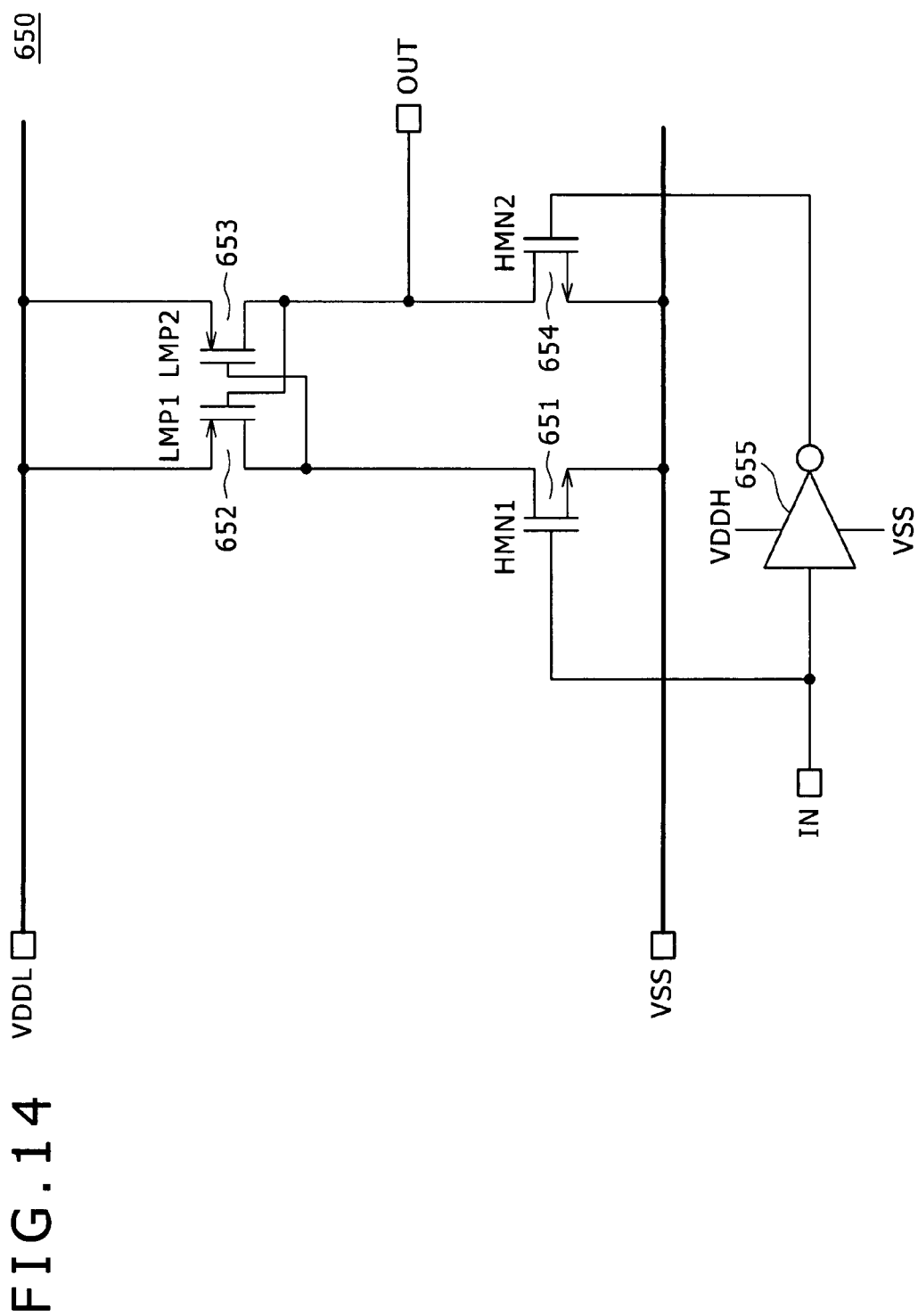
FIG. 14 shows a circuit configuration of a level conversion circuit according to a sixth existing example.

A comparison of the level conversion circuit 50 with the existing level conversion circuit 500 shown in FIG. 11 indicates that while the level conversion circuit 50 has a cascade connection as in FIG. 11, the configuration according to the first embodiment of the present invention drives the cascaded NMOS transistors (HMN1 (14) and HMN2 (15)) by the CMOS constitution, thus not only achieving high operating speed at an OFF (turnoff) time and enabling high-speed operation but also improving a Duty (duty) ratio.

Description will next be made of an operation at a starting time of the level conversion circuit 50. There are two kinds of power supply voltages for the level conversion circuit 50, that is, the high voltage $V_{DDH}$ of the high voltage power supply VDDH and the low voltage $V_{DDL}$ of the low voltage power supply VDDL, and it is unknown which of the voltages rises first. The operation of the level conversion circuit 50 is prevented from becoming unstable because of this.

A case where the high voltage power supply VDDH starts before the low voltage power supply VDDL will first be described with reference to FIG. 2A.

At time t1, the high voltage power supply VDDH starts up, and correspondingly the voltage of the POW_GOOD terminal also rises. The voltage of the high voltage power supply VDDH becomes higher than the voltage VA between time t1 and time t2. At time t2, the high voltage power supply VDDH is stabilized at 3.3 V, for example, and the POW_GOOD terminal is also stabilized and outputs a voltage of 3.3 V.

At time t3, the low voltage power supply VDDL starts up, and the low voltage $V_{DDL}$ rises. The low voltage $V_{DDL}$ becomes the voltage VB at time t4.

During a period until the above-described condition B is satisfied while the condition A has been satisfied, the BIAS voltage is the low voltage $V_{DDL}$. When the low breakdown voltage CMOS transistors are in undetermined operation, the voltages of the node A and the node B are expressed by the following Equation (5).

[Equation 4]

$$V_{DDL} - V\text{nthh} \quad (5)$$

The voltages of the node A and the node B are clamped to the voltage of Equation (5). At the time of low voltage ($V_{DDL}$) at which the low breakdown voltage CMOS transistors are in undetermined operation, the value of Equation (5) is a negative value. Therefore, at this time, the level conversion circuit 50 is in a shutdown state.

Because the POW_GOOD terminal outputs the high voltage $V_{DDH}$ of the high voltage power supply VDDH, the output is given an initial value of the $V_{SS}$ level by the shutdown transistor (HMN3 (11)).

After time t4, when the voltage level ($V_{DDL}$) of the low voltage power supply VDDL rises and thus the condition B is also satisfied, the POW_GOOD signal is changed to the $V_{SS}$ level, and the bias (BIAS) voltage becomes the value expressed by Equation (1), so that normal operation is performed.

That is, because the gate voltage of the transistor HMN3 (11) is set at the $V_{SS}$ level, cutoff is effected, and the level conversion circuit 50 makes a transition to normal operation.

At time t7, the voltage $V_{DDL}$ of the low voltage power supply VDDL becomes lower than the voltage VB. Then, at time t8, the POW_GOOD terminal reaches 3.3 V, so that the transistor HMN3 (11) is in on operation to shut down the level conversion circuit 50.

A case where the low voltage power supply VDDL starts before the high voltage power supply VDDH will next be described with reference to FIG. 2B.

In this case, during a period until the above-described condition A is satisfied while the condition B has been satisfied, the voltage of the bias terminal is the voltage $V_{DDL}$. Since the condition B is satisfied, the low breakdown voltage CMOS transistors operate normally. However, since the node A and the node B are similarly clamped to the value expressed by Equation (5), the level conversion circuit 50 is in a shutdown state (times t1 to t4). That is, because the POW_GOOD terminal outputs the voltage $V_{DDH}$, when the value of the voltage $V_{DDH}$ exceeds the threshold voltage Vnthh, the output is given the initial value of the $V_{SS}$ level by the shutdown transistor (HMN3 (11)) (time t4). Thereafter, the voltage level of the high voltage power supply VDDH rises and thus the condition A is satisfied, the POW_GOOD signal is changed to the V$_{SS}$ level, and the BIAS voltage becomes the value expressed by Equation (1), so that normal operation is performed (time t5).

As described above, regardless of which of the voltages of the high voltage power supply VDDH and the low voltage power supply VDDL rises first, the operation of the level conversion circuit 50 is stopped until both the power supplies VDDH and VDDL are stabilized. After the power supplies are stabilized, the level conversion circuit 50 performs normal level converting operation for a period from time t5 to time t6 shown in FIG. 2A, and performs normal level converting operation for a period from time t5 to time t8 shown in FIG. 2B.

During the normal operation, when a signal having an "H" level is input to the input terminal IN of the inverter INBA 16 performing low-voltage operation, an "H" level signal is output to the node B as the output of the inverter INBC 18, and an "L" level signal is output to the node A as the output of the inverter INBB 17.

At this time, a voltage 0.6+Vnthn [V] is supplied to the gates of the transistors HMN1 (14) and HMN2 (15). Since the output of the inverter INBB 17 is at the "L" level, the transistor HMN1 (14) is brought into an ON operation state, and the voltage of the drain of the transistor HMN1 (14) is decreased. With the decrease in the voltage of the drain of the transistor HMN1 (14), the voltage of the gate of the transistor HMP2 (13) is also decreased, so that the transistor HMP2 (13) is brought into an ON operation state. On the other hand, the drain of the transistor HMP2 (13) makes a transition to an "H" level, and thus the gate of the transistor HMP1 (12) is also set at the "H" level, so that a latch state is obtained. Hence, the drain of the transistor HMP2 (13) is set to the voltage level of the high voltage power supply VDDH, and thus the drain of the transistor HMP2 (13) is latched to the "H" level. That is, when the input signal is at the "H" level, a signal having the "H" level corresponding to the high voltage power supply VDDH is output from the output OUT.

On the other hand, when a signal having an "L" level is input to the inverters INBA (16) and INBB (17) performing low-voltage operation, an operation opposite to the above-described operation is performed, whereby a signal having an "L" level is output from the output OUT.

In this case, the bias (BIAS) voltage is supplied from the bias circuit 10 having the voltage detecting function to the gates of the transistors HMN1 (14) and HMN2 (15). As a result, the voltages of the node A and the node B can be clamped to the bias voltage $\{(V_{BIAS})-Vnthn\}$, that is, the voltage V$_{DDL}$. It is thus possible to prevent the breakdown of the inverters INBB 17 and INBC 18 formed by low breakdown voltage MOS transistors.

FIG. 3 is a diagram of configuration of a voltage lowering type level conversion circuit 100 according to a second embodiment of the present invention. In this level conversion circuit 100, a bias circuit 110 provided with a voltage detecting function has the same configuration and function as in FIG. 1.

The circuit configuration of the level conversion circuit 100 shown in FIG. 3 will first be described. A high voltage power supply VDDH and a low voltage power supply VDDL are connected to the bias circuit 110 having the voltage detecting function. A POW_GOOD terminal is connected to the gates of transistors HMP1 (113), HMN3 (111), and HMN4 (112). A bias (BIAS) terminal is connected to the gate of a transistor HMN1 (115). The drain of the transistor HMN3 (111) is connected to a node A. The source of the transistor HMN3 (111) is connected to a reference voltage power supply VSS. The drain of the transistor HMN4 (112) is connected to a node B. The source of the transistor HMN4 (112) is connected to the reference voltage power supply VSS. The source of the transistor HMP1 (113) is connected to the high voltage power supply VDDH. The drain of the transistor HMP1 (113) is connected to the source of a transistor HMP2 (114). The gate of the transistor HMP2 (114) is connected to an input terminal IN. The drain of the transistor HMP2 (114) is connected to the node A, the drain of the transistor HMN1 (115), the drain of the transistor HMN3 (111), and the gate of a transistor HMN5 (118). The source of the transistor HMN1 (115) is connected to the node B, the drain of the transistor HMN4 (112), the drain of a transistor HMN2 (116), and the gate of a transistor LMP1 (117). The gate of the transistor HMN2 (116) is connected to the input terminal IN. The source of the transistor HMN2 (116) is connected to the reference voltage power supply VSS. The source of the transistor LMP1 (117) is connected to the low voltage power supply VDDL. The drain of the transistor LMP1 (117) is connected to the drain of the transistor HMN5 and an output terminal OUT. The gate of the transistor HMN5 (118) is connected to the node A. The source of the transistor HMN5 (118) is connected to the reference voltage power supply VSS.

As described above, the transistor HMP2 (114) and the transistor HMN2 (116) form an inverter. The transistor HMN1 (115) cascade-connected between the transistor HMP2 (114) and the transistor HMN2 (116) clamps the node (Node) B to the voltage V$_{DDL}$ of the low voltage power supply VDDL. The gates of the transistors HMN3 (111), HMN4 (112), and HMP1 (113) are connected to the POW_GOOD terminal. At a starting time, a current path of the transistor HMP2 (114) and the transistor HMN2 (116) is cut, and the potential of the node (Node) A and the node (Node) B is set to a V$_{SS}$ level, so that a shutdown is surely effected.

While the gate of the transistor LMP1 (117) is connected to the node B, the node B is clamped to the voltage of the low voltage power supply VDDL, and therefore does not exceed the breakdown voltage of the transistor LMP1 (117). The gate of the transistor LMP1 (117) is connected to the node B. The transistor LMP1 (117) forms an inverter in a second stage in combination with the transistor HMN5 (118). This constitution operates with the low voltage V$_{DDL}$ of the low voltage power supply VDDL, and is capable of high-speed operation, being free from a cross-coupling connection.

The bias circuit 110 having the voltage detecting function is the same as in FIG. 1, and thus description thereof will be omitted.

Description will next be made of an operation at a starting time of the level conversion circuit 100. Also in this case, it is unknown which of the high voltage power supply VDDH and the low voltage power supply VDDL starts up first at the starting time. This is detected to obtain stable operation.

A case where the high voltage power supply VDDH starts before the low voltage power supply VDDL will first be described.

As shown in FIG. 2A, the high voltage power supply VDDH starts up at time t1, and becomes stable at time t2. Then, a high voltage V$_{DDH}$, for example a voltage of 3.3 V is output from the POW_GOOD terminal to be applied to the gates of the transistors HMP1 (113), HMN3 (111), and HMN4 (112). Because the high voltage V$_{DDH}$ (3.3 V) is applied to the gate of the transistor HMP1 (113), the transistor HMP1 (113) is set in an OFF state, and thus a circuit on the high voltage side is shut down.

The power supply voltage of the low voltage power supply VDDL rises at time t3, becomes higher than voltage VB at time t4, and is stabilized at time t5. The voltage of the POW_

GOOD terminal of the bias circuit 110 having the voltage detecting function falls at time t4, and changes to the voltage $V_{SS}$ of the reference voltage power supply VSS at time t5. For a period from time t4 to time t5, the gate voltage of the transistor HMP1 (113) is lowered, so that the transistor HMP1 (113) makes a transition to an ON operation state and the circuit on the high voltage side starts operation, whereas the transistor HMN4 (112) is brought into an OFF operation state, and thus the circuit is set in an operating state. With this, a bias voltage is output from the bias (BIAS) terminal of the bias circuit 110 having the voltage detecting function to be supplied to the gate of the transistor HMN1 (115).

As described above, for a period from time t1 to time t3, until the above-described condition B is satisfied while the condition A has been satisfied, input data is determined because the high voltage power supply VDDH has started, whereas the level conversion circuit 100 is shut down. Until the voltage value $V_{DDL}$ of the low voltage power supply VDDL exceeds a threshold value Vpthl of the low breakdown voltage P-channel MOS transistor, the output is in a state of Hiz (high impedance). When the voltage value $V_{DDL}$ of the low voltage power supply VDDL exceeds the threshold value Vpthl of the low breakdown voltage P-channel MOS transistor, the output value becomes the voltage value $V_{DDL}$ of the low voltage power supply VDDL.

Then, after the voltage value $V_{DDL}$ of the low voltage power supply VDDL satisfies the condition B at time t4, the POW_GOOD terminal reaches the $V_{SS}$ level, and the BIAS voltage reaches a voltage $V_{DDL}$+Vnthh, so that the circuit starts normal operation.

A case where the low voltage power supply VDDL starts before the high voltage power supply VDDH will next be described.

In this case, during a period until the above-described condition A is satisfied while the condition B has been satisfied, the high voltage power supply VDDH is in a process of starting, and input data is in an undetermined state (time t4). However, because the POW_GOOD terminal is at high voltage ($V_{DDH}$) level, the potential of the node A is weak at the $V_{SS}$ level until the voltage $V_{DDH}$ of the high voltage power supply VDDH exceeds the threshold voltage Vnthh. When the voltage $V_{DDH}$ of the high voltage power supply VDDH exceeds the threshold voltage Vnthh, the potential of the node A becomes the $V_{SS}$ level, and therefore the output becomes the $V_{DDL}$ level.

Then, after the voltage $V_{DDH}$ of the high voltage power supply VDDH satisfies the condition A, the POW_GOOD terminal is changed to the $V_{SS}$ level, and the bias (BIAS) voltage becomes the voltage $V_{DDL}$+Vnthh, so that the circuit starts normal operation (time t5).

Description will next be made of a circuit operation after stabilization of the voltages of the high voltage power supply VDDH and the low voltage power supply VDDL which voltages are supplied to the level conversion circuit 100.

The POW_GOOD terminal of the bias circuit 110 having the voltage detecting function makes a transition to the voltage $V_{SS}$ of the reference voltage power supply VSS, and a bias voltage is output from the bias (BIAS) terminal. The transistor HMP1 (113) is set in an ON operation state. The transistor HMN3 (111) and the transistor HMN4 (112) are set in an OFF operation state. The bias voltage is supplied to the gate of the transistor HMN1 (115). The node B is clamped to a voltage $\{(V_{BIAS})-Vnthn\}$, that is, the voltage $V_{DDL}$.

When a signal having an "H" level is input to the input terminal IN, a voltage having the "H" level is supplied to the gate of the transistor HMN2 (116) and the gate of the transistor HMP2 (114). As a result, the transistor HMN2 (116) is set in an ON operation state, and the transistor HMP2 (114) is set in an OFF state. Therefore the node B and the node A are both at an "L" level. At this time, the gates of the transistor LMP1 (117) and the transistor HMN5 (118) are both at the "L" level. Thus, the output OUT is at an "H" level.

When a signal having an "L" level is input to the input terminal IN, on the other hand, the transistor HMN2 (116) is set in an OFF operation state, and the transistor HMP1 (113) and the transistor HMP2 (114) are in an ON operation state, thus raising the voltage of the node A. The transistor HMN5 (118) is therefore set in an ON operation state. Hence, the output OUT makes a transition to an "L" level.

Thus, the converting operation of the level conversion circuit 100 is stopped by the bias circuit 110 having the voltage detecting function until the high voltage power supply VDDH and the low voltage power supply VDDL are stabilized, and normal level converting operation is performed after the voltages of the high voltage power supply VDDH and the low voltage power supply VDDL are stabilized.

FIG. 4 shows a concrete configuration of a bias circuit 150 having a voltage detecting function according to a third embodiment of the present invention. This bias circuit 150 having the voltage detecting function is the bias circuit 10 having the voltage detecting function as shown in FIG. 1 or the bias circuit 110 having the voltage detecting function as shown in FIG. 3.

The source of a transistor HMP4 (151) is connected to a high voltage power supply VDDH. The drain of the transistor HMP4 (151) is connected to one terminal of a resistance R3 (152). The gate of the transistor HMP4 (151) is supplied with an enable (Enable) signal. Another terminal of the resistance R3 (152) is connected to the gate of a transistor HMN5 (155) and one terminal of a resistance R4 (153). Another terminal of the resistance R4 (153) is connected to a reference voltage power supply VSS.

One terminal of a resistance R2 (154) is connected to the high voltage power supply VDDH. Another terminal of the resistance R2 (154) is connected to the gate of a transistor HMP3 (157) and the drain of the transistor HMN5 (155). A control signal POW_GOOD is output from a common point of connection of the resistance R2 (154) and the drain of the transistor HMN5 (155).

The source of the transistor HMN5 (155) is connected to the drain of a transistor LMN1 (156). The gate of the transistor LMN1 (156) is connected to a low voltage power supply VDDL. The source of the transistor LMN1 (156) is connected to the reference voltage power supply VSS.

The source of a transistor HMP3 (157) is connected to the high voltage power supply VDDH. The drain of the transistor HMP3 (157) is connected to one terminal of a resistance R1 (158). Another terminal of the resistance R1 (158) is connected to the drain and gate of a transistor HMN4 (159), and outputs a bias (BIAS) voltage. The source of the transistor HMN4 (159) is connected to the low voltage power supply VDDL.

The operation of the bias circuit 150 having the voltage detecting function will next be described.

At a starting time, there are a case where the high voltage power supply VDDH starts before the low voltage power supply VDDL and an opposite case where the low voltage power supply VDDL starts before the high voltage power supply VDDH.

The case where the high voltage power supply VDDH starts before the low voltage power supply VDDL will first be described.

When the Enable signal is the voltage $V_{DDH}$ of the high voltage power supply VDDH, the transistor HMP4 (151) is in an OFF operation state, and the transistor HMN5 (155) and the transistor HMP3 (157) are in an OFF operation state. Therefore, the circuit is in a shutdown state, and no current flows. As a result, the POW_GOOD terminal remains at the $V_{DDH}$ level, and the bias (BIAS) terminal outputs the $V_{DDL}$ level.

When the Enable signal has the $V_{SS}$ level of the reference voltage power supply VSS and the voltage $V_{DDL}$ exceeds the threshold value of the transistor LMN1 (156), because the transistor HMN5 (155) is already in an ON operation state, a current starts flowing through a path of the resistance R2 (154).

In order to set the POW_GOOD terminal to the $V_{SS}$ level, driving capability of the transistor LMN1 (156) needs to be set so as to satisfy the following condition.

[Equation 5]

$$V_{DDH}/R3 \leq A \cdot W/L \cdot (V_{DDL} - Vnthl)^2 \quad (6)$$

where A is a constant, W and L are parameter values of the transistor LMN1 (156), and Vnthl is the threshold voltage of the low breakdown voltage N-channel MOS transistor.

In addition, the above-described condition B has to be satisfied to ensure a free voltage sequence. Hence, the values of the parameters R3, W, and L are set such that the value of the voltage $V_{DDL}$ when the voltage $V_{DDL}$ rises enough to satisfy Equation (6) is higher than Vpthhl.

After the voltage $V_{DDL}$ rises enough to satisfy Equation (6), the POW_GOOD terminal is changed to the $V_{SS}$ level, the transistor HMP3 (157) is set in an ON operation state, and the bias (BIAS) terminal outputs the value expressed by Equation (1). In this case, the role of the resistance R4 (153) is to limit a current flowing through the transistor HMP4 (151).

At this time, the condition A and the condition B are satisfied, and the bias (BIAS) circuit 150 having the voltage detecting function in FIG. 4 is realized.

The case where the low voltage power supply VDDL starts before the high voltage power supply VDDH will next be described.

When the Enable signal has the $V_{DDH}$ level, the circuit is in a shutdown state, and no current flows. Consequently, the POW_GOOD terminal remains at the $V_{DDH}$ level, and the bias (BIAS) terminal outputs the $V_{DDL}$ level.

In a state in which the Enable signal has the $V_{SS}$ level, when the voltage $V_{DDH}$ exceeds the threshold value of a high breakdown voltage PMOS transistor, a voltage VG5 having substantially a value expressed by the following equation is output to the gate of the transistor HMN5 (155).

[Equation 6]

$$VG5 = V_{DDH} \cdot R4/(R3+R4) \quad (7)$$

When the value of the voltage $V_{DDH}$ rises and the value of the voltage VG5 in Equation (7) exceeds the threshold value of the high breakdown voltage NMOS transistor, the transistor LMN1 (156) and the transistor HMN5 (155) are both in an ON operation state, so that a current flows through the resistance R2 (154) and the potential of the POW_GOOD terminal is changed from the $V_{DDH}$ level to the $V_{SS}$ level. At this time, the transistor HMP3 (157) is also on. Therefore, a current flows through a path of the resistance R1 (158) and the transistor HMN4 (159), and substantially the value expressed by Equation (1) is output as the potential of the BIAS terminal.

At this time, the condition A and the condition B are satisfied, and the bias (BIAS) circuit 150 having the voltage detecting function in FIG. 4 is realized.

The transistor LMN1 (156) is a low breakdown voltage MOS transistor. The drain of the transistor LMN1 (156) has the source potential of the transistor HMN5 (155), and the potential is clamped to a value expressed by the following equation.

[Equation 7]

$$NodeC = V_{DDH} \cdot R4/(R3+R4) - Vnthh \quad (8)$$

A setting has to be made such that this value does not exceed the breakdown voltage of the low breakdown voltage MOS transistor.

Figure 5:
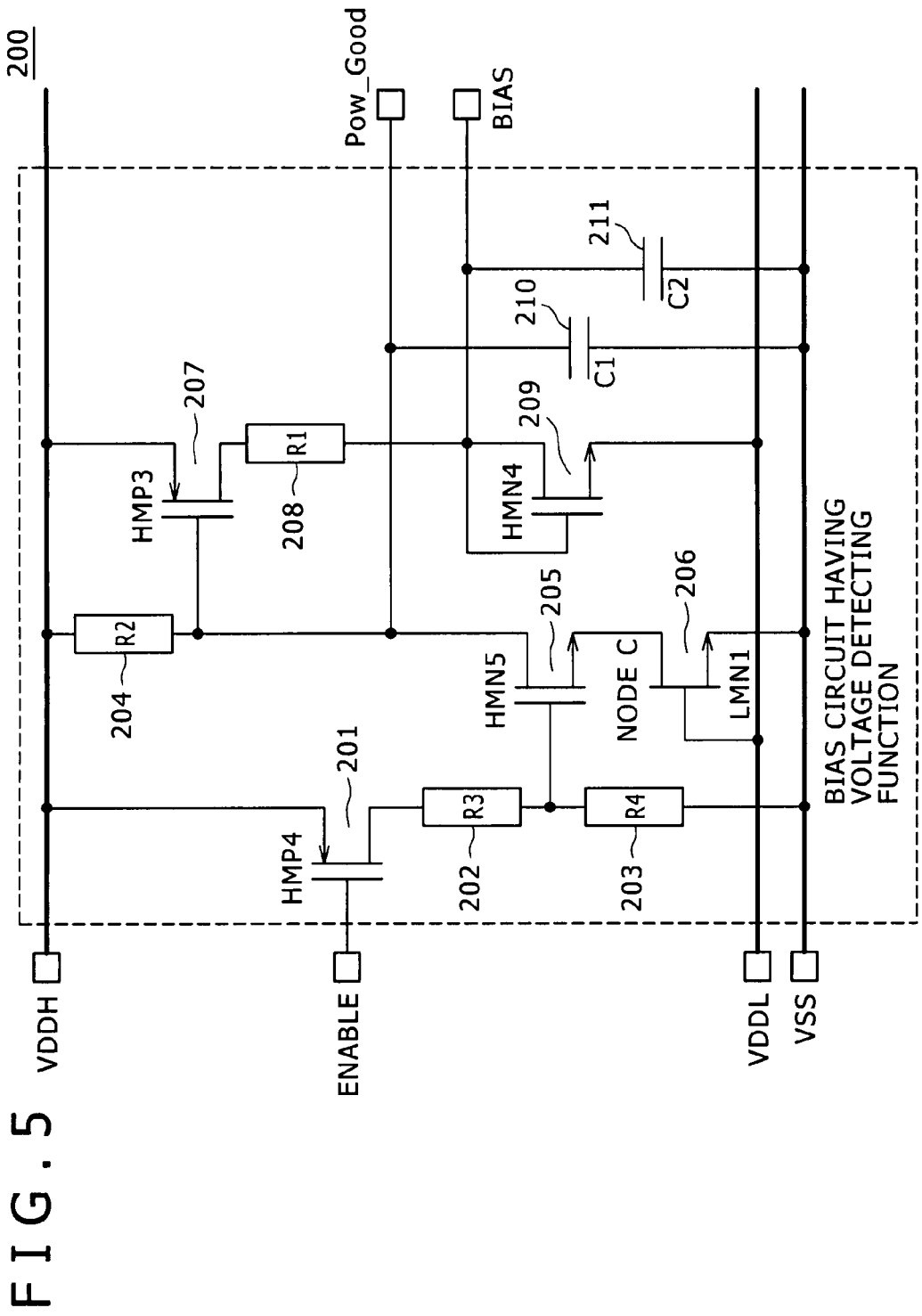
FIG. 5 shows a circuit configuration of a bias circuit having a voltage detecting function according to a fourth embodiment, which circuit is included in the level conversion circuits shown in FIG. 1 and FIG. 3.

FIG. 5 shows a concrete circuit configuration of a bias circuit 200 having a voltage detecting function according to a fourth embodiment of the present invention.

The bias circuit 200 having the voltage detecting function which circuit is shown in FIG. 5 and the bias circuit 150 having the voltage detecting function which circuit is shown in FIG. 4 differ from each other in that a capacitance is added to the POW_GOOD terminal and the bias (BIAS) terminal of the bias circuit 200.

Specifically, while the connection and configuration of the resistances and the transistors from the input terminal for the Enable signal to the POW_GOOD and BIAS terminals are the same, a capacitance C1 (210) is connected between the POW_GOOD terminal and a reference voltage power supply VSS, and a capacitance C2 (211) is connected between the BIAS terminal and the reference voltage power supply VSS. In this case, the connection of the basic circuit is the same as in FIG. 4, and therefore description thereof will be omitted.

Because the capacitance C1 (210) is connected to the output terminal POW_GOOD and the capacitance C2 (211) is connected to the BIAS terminal, erroneous operation due to noise and coupling can be prevented.

Figure 6:
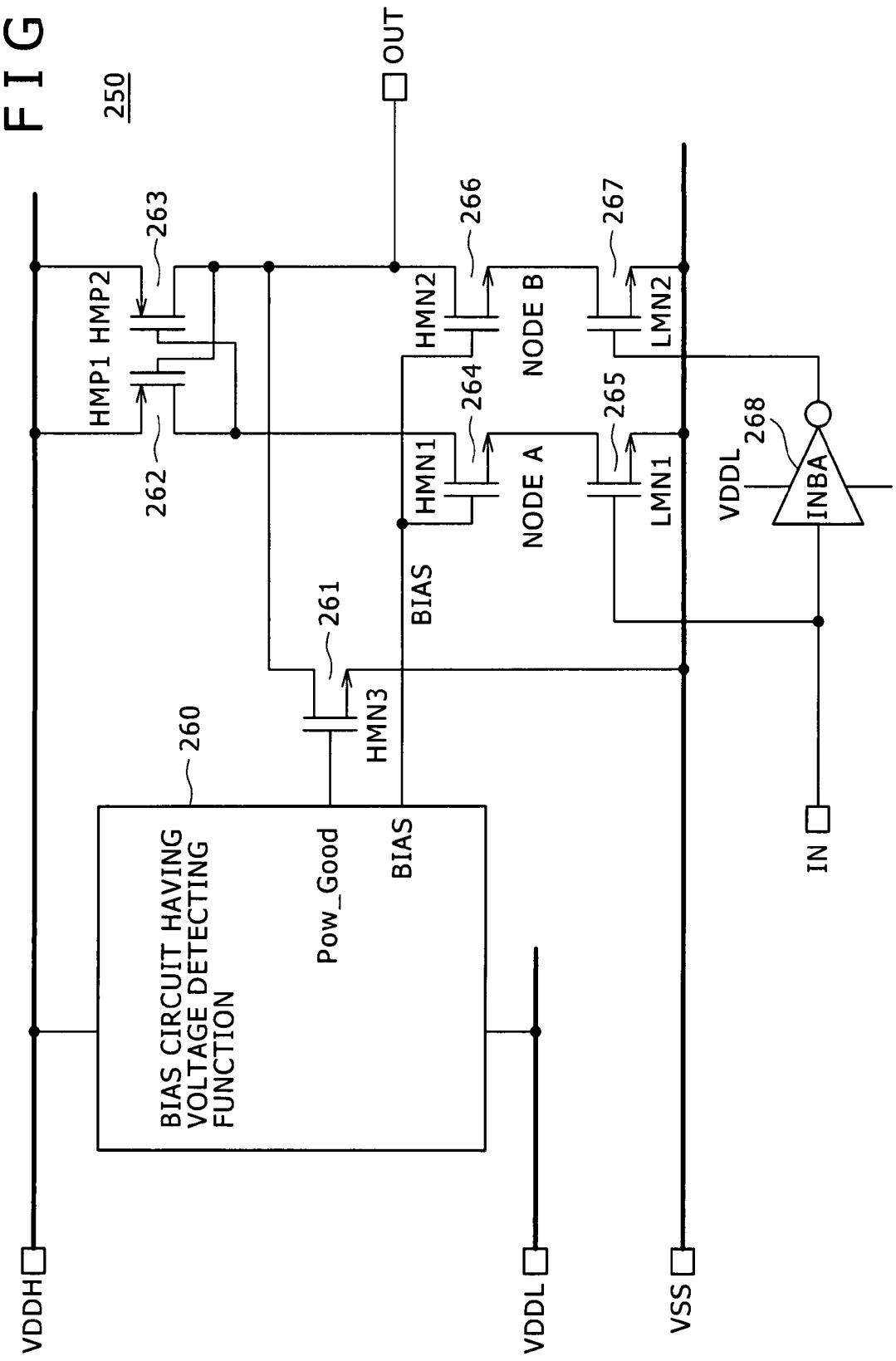
FIG. 6 shows a circuit configuration of a level conversion circuit according to a fifth embodiment.

FIG. 6 shows a circuit configuration of a voltage raising type level conversion circuit 250 according to a fifth embodiment of the present invention.

A POW_GOOD terminal is connected to the gate of a transistor HMN3 (261). The drain of the transistor HMN3 (261) is connected to the drain of a transistor HMP2 (263) forming a latch circuit and the gate of a transistor HMP1 (262). The source of the transistor HMN3 (261) is connected to a reference voltage power supply VSS.

The source of the transistor HMP1 (262) is connected to a high voltage power supply VDDH. The gate of the transistor HMP1 (262) is connected to the drain of the transistor HMP2 (263). The drain of the transistor HMP1 (262) is connected to the drain of a transistor HMN1 (264). The source of the transistor HMP2 (263) is connected to the high voltage power supply VDDH. The gate of the transistor HMP2 (263) is connected to the drain of the transistor HMP1 (262) and the drain of the transistor HMN1 (264). The drain of the transistor HMP2 (263) is connected to the drains of the transistor HMN3 (261) and a transistor HMN2 (266).

The gate of the transistor HMN1 (264) is connected to a bias (BIAS) terminal and the gate of the transistor HMN2 (266). The source of the transistor HMN1 (264) is connected to the drain of a transistor LMN1 (265). The gate of the transistor LMN1 (265) is connected to an input terminal IN and the input of an inverter INBA (268). The source of the transistor LMN1 (265) is connected to the reference voltage power supply VSS.

The drain of the transistor HMN2 (266) is connected to the drain of the transistor HMN3 (261), the drain of the transistor HMP2 (263), and an output OUT. The gate of the transistor HMN2 (266) is connected to the bias (BIAS) terminal. The source of the transistor HMN2 (266) is connected to the drain of a transistor LMN2 (267).

The gate of the transistor LMN2 (267) is connected to the output of the inverter INBA (268). The source of the transistor LMN2 (267) is connected to the reference voltage power supply VSS.

When the POW_GOOD terminal is at an "H" level, the transistor HMN3 (261) is in an ON operation state to set the output OUT of the level conversion circuit to an "L" level. At this time, bias (BIAS) voltage is voltage $V_{DDL}$. Therefore the operation of the level conversion circuit 250 is shut down.

On the other hand, when the POW_GOOD terminal is set at an "L" level, the transistor HMN3 (261) is set in an OFF operation state. At this time, the bias (BIAS) voltage having a level $V_{DDL}$+Vnthl is supplied to the gates of the transistor HMN1 (264) and the transistor HMN2 (266). The level conversion circuit 250 consequently makes a transition to a normal operation state.

When an input signal having an "H" level is applied from the input terminal IN, the transistor LMN1 (265) performs an ON operation, and thus the drain of the transistor LMN1 (265) is at an "L" level. As a result, the voltage of the drain of the transistor HMP1 (262) is lowered. Then, the voltage of the gate of the transistor HMP2 (263) is also lowered. Therefore, the transistor HMP2 (263) is set in an ON operation state, and thus the drain of the transistor HMP2 (263) is set at an "H" level. This value is latched, and the output OUT is set at the "H" level.

On the other hand, in a case of an input having an "L" level, the transistor LMN1 (265) and the transistor HMN1 (264) are off, and the transistor LMN2 (267) and the transistor HMN2 (266) are in an ON operation state, so that the output OUT is set at an "L" level.

The level conversion circuit 250 has a circuit configuration formed by changing the CMOS input to NMOS. While the CMOS input enables higher-speed operation, the higher-speed operation is not necessary in some cases depending on purpose, and therefore it is possible to reduce the number of circuit elements and reduce layout area.

Figure 7:
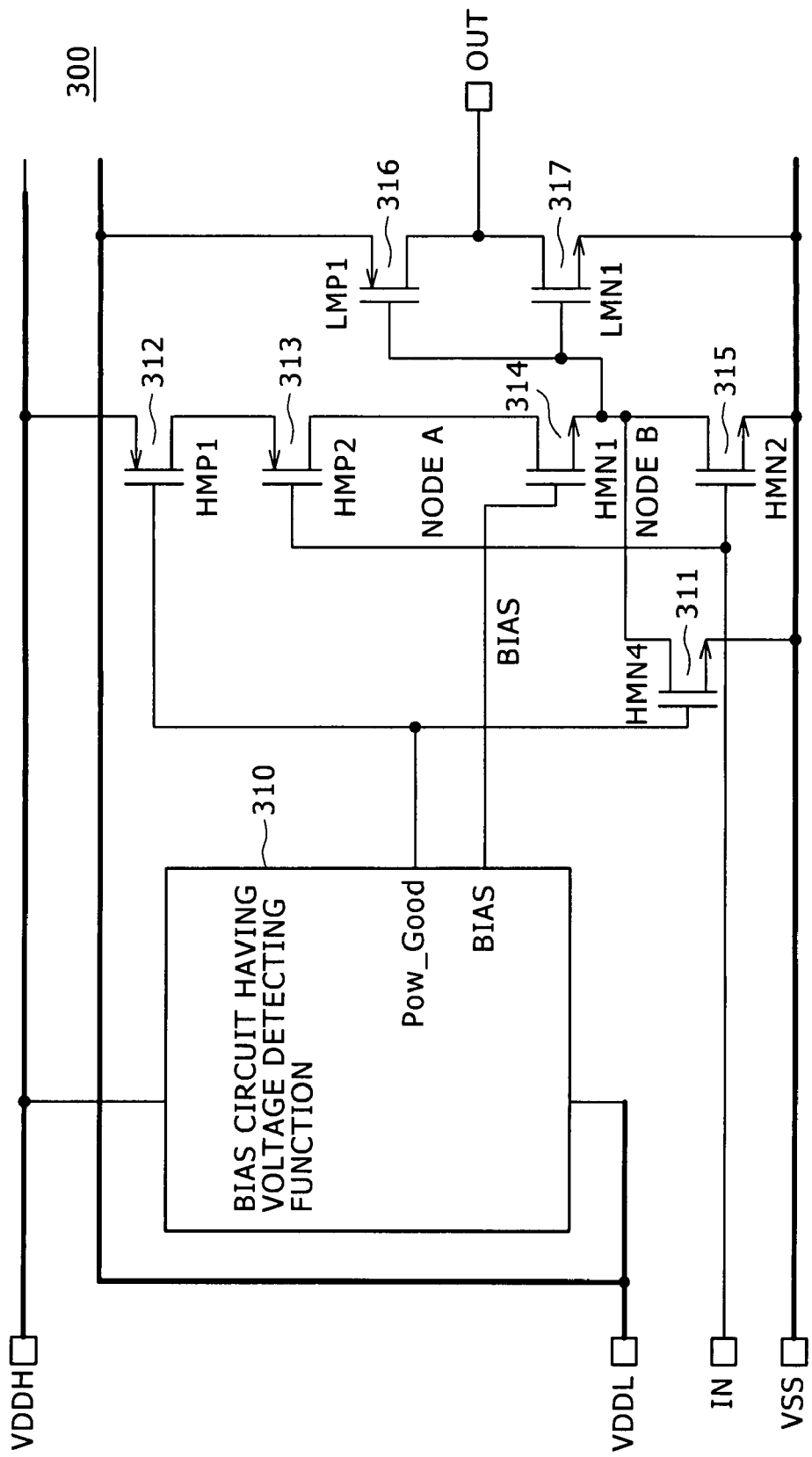
FIG. 7 shows a circuit configuration of a level conversion circuit according to a sixth embodiment.

FIG. 7 shows a circuit configuration of a voltage lowering type level conversion circuit 300 according to a sixth embodiment.

This level conversion circuit 300 is a modification of the level conversion circuit 100, and is formed by changing the high breakdown voltage NMOS transistor of the inverter in the second stage in the level conversion circuit 100 to a low breakdown voltage NMOS transistor, changing the node to which the gate of the NMOS transistor is connected from the node (Node) A to the node (Node) B, and removing the transistor HMN3 from the level conversion circuit 100.

A POW_GOOD terminal is connected to the gate of a transistor HMP1 (312) and the gate of a transistor HMN4 (311). The source of the transistor HMP1 (312) is connected to a high voltage power supply VDDH. The drain of the transistor HMP1 (312) is connected to the source of a transistor HMP2 (313). The gate of the transistor HMP2 (313) is connected to an input terminal IN and the gate of a transistor HMN2 (315). The drain of the transistor HMP2 (313) is connected to the drain of a transistor HMN1 (314).

The gate of the transistor HMN1 (314) is connected to a bias (BIAS) terminal. The source of the transistor HMN1 (314) is connected to the drain of a transistor HMN4 (311), the drain of the transistor HMN2 (315), and the gates of a transistor LMP1 (316) and a transistor LMN1 (317) forming a CMOS.

The source of the transistor HMN4 (311) and the source of the transistor HMN2 (315) are connected to a reference voltage power supply VSS. The source of the transistor LMP1 (316) is connected to a low voltage power supply VDDL. The drain of the transistor LMP1 (316) is connected to the drain of the transistor LMN1 (317) and an output OUT. The source of the transistor LMN1 (317) is connected to the reference voltage power supply VSS.

The level conversion circuit 300 supplies a control signal from the POW_GOOD terminal to the transistor HMP1 (312) and the transistor HMN4 (311), whereby a level conversion unit is controlled to be shut down or set in an operating state.

When the POW_GOOD terminal is at an "H" level, the transistor HMN4 (311) is in an ON operation state, and the transistor HMP1 (312) is in an OFF state. The node B is fixed at an "L" level, and level converting operation is stopped. When the POW_GOOD terminal is set to an "L" level, the transistor HMN4 (311) is brought into an OFF state, and the transistor HMP1 (312) is brought into an operating state. Therefore the level conversion circuit 300 is set in an operating state.

When a signal having an "H" level is supplied from the input terminal IN, the transistor HMN2 (315) is set in an ON operation state, and the transistor HMP2 (313) is set in an OFF state. The node B is set to an "L" level, so that the transistor LMP1 (316) is set in an ON operation state and the transistor LMN1 (317) is set in an OFF operation state. Thus, the output OUT is set to an "H" level.

On the other hand, when a signal having an "L" level is supplied from the input terminal IN, the transistor HMN2 (315) is set in an OFF operation state, and the transistor HMP2 (313) is set in an ON operation state. The transistor HMP1 (312) is in an ON operation state, and accordingly the voltage of the node B is raised. Therefore, the transistor LMN1 (317) is set in an ON operation state, and the transistor LMP1 (316) is set in an OFF operation state. Thus, the output OUT is set to an "L" level.

The level conversion circuit 300 is decreased in operating speed when driven by the low voltage power supply having the $V_{DDL}$ level. However, the level conversion circuit 300 has an advantage of making it possible to reduce the number of elements when used in an area where operating speed does not matter.

Figure 8:
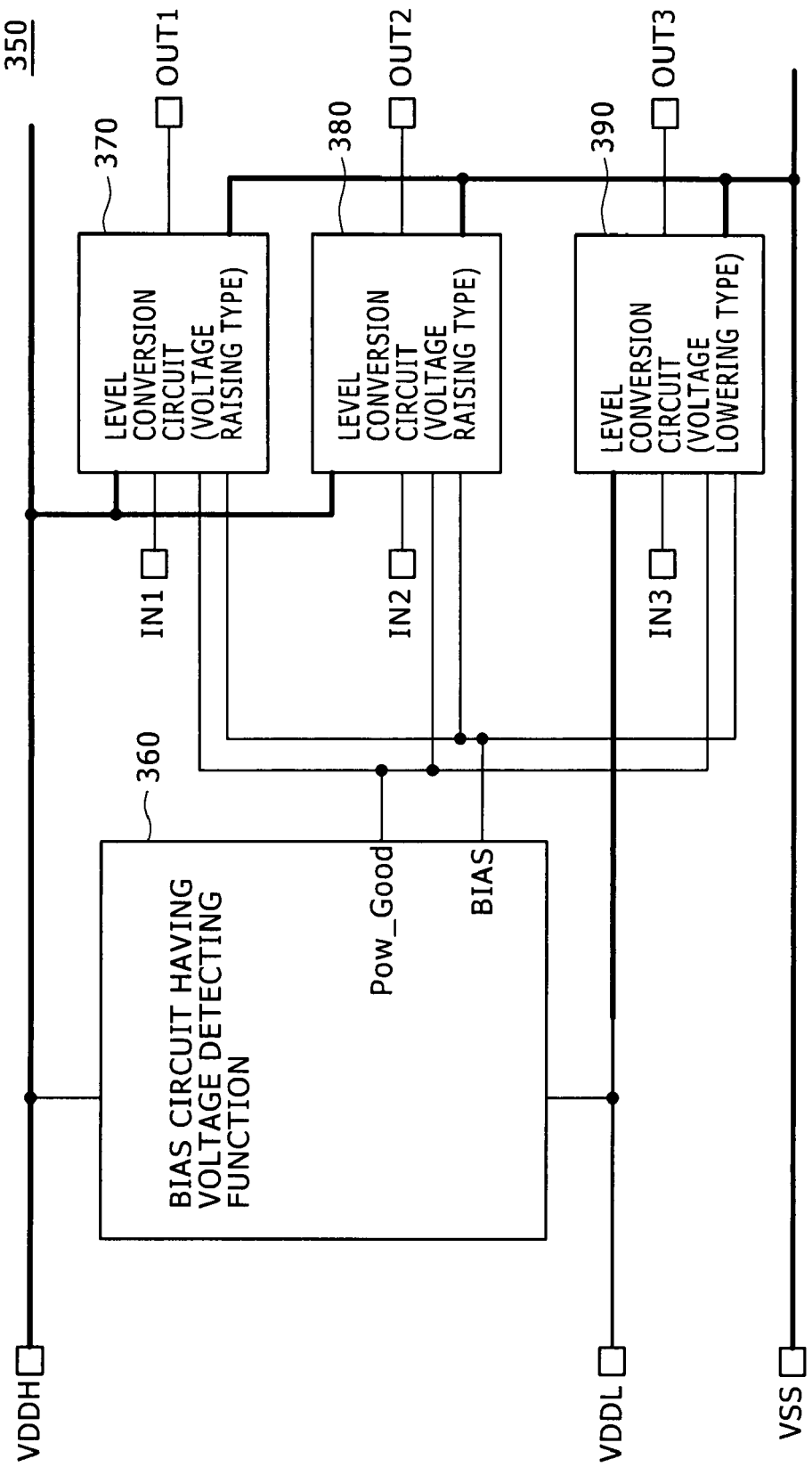
FIG. 8 shows a block configuration of an input-output device according to a seventh embodiment.
Figure 9:
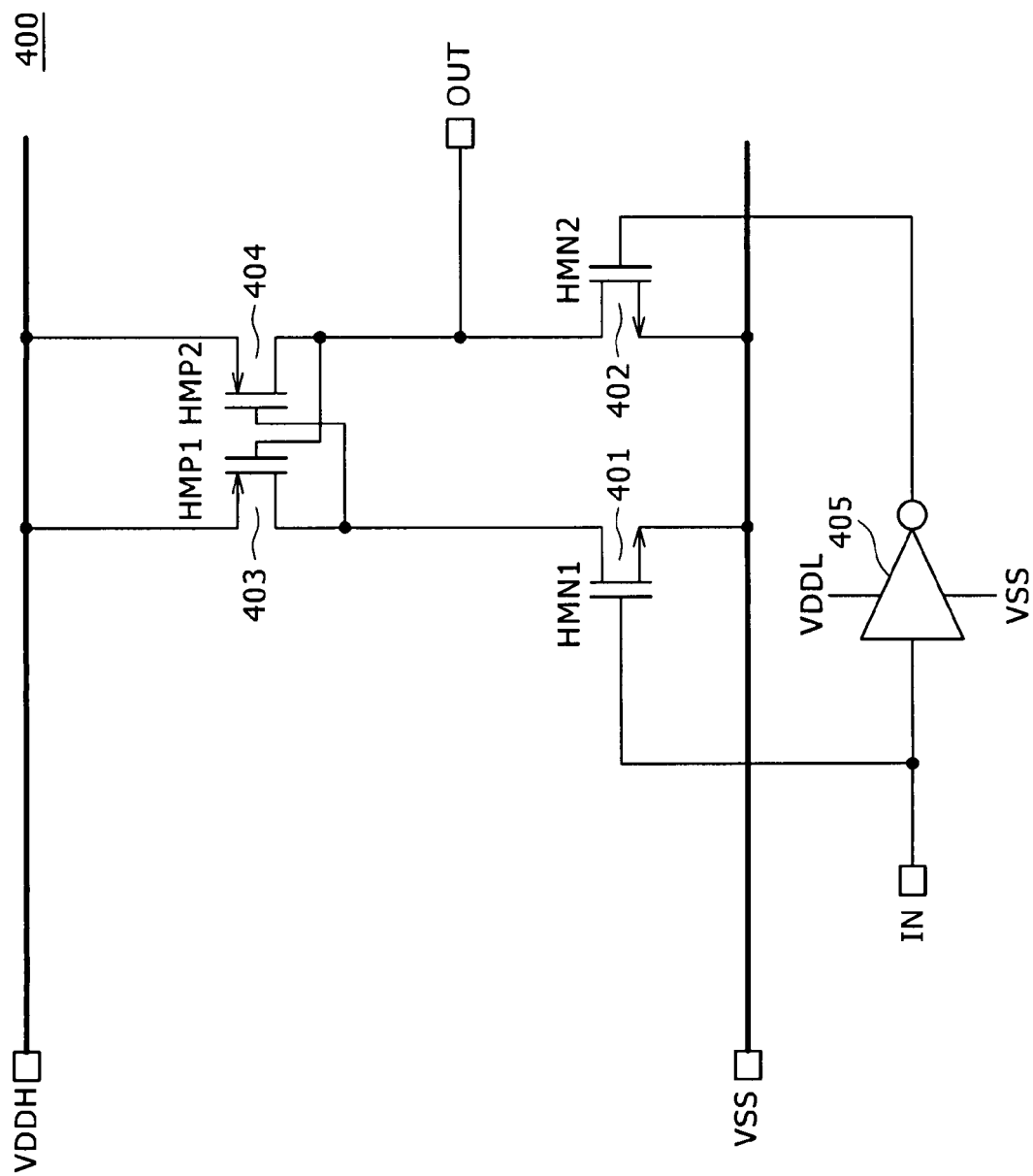
FIG. 9 shows a circuit configuration of a level conversion circuit according to a first existing example.
Figure 10:
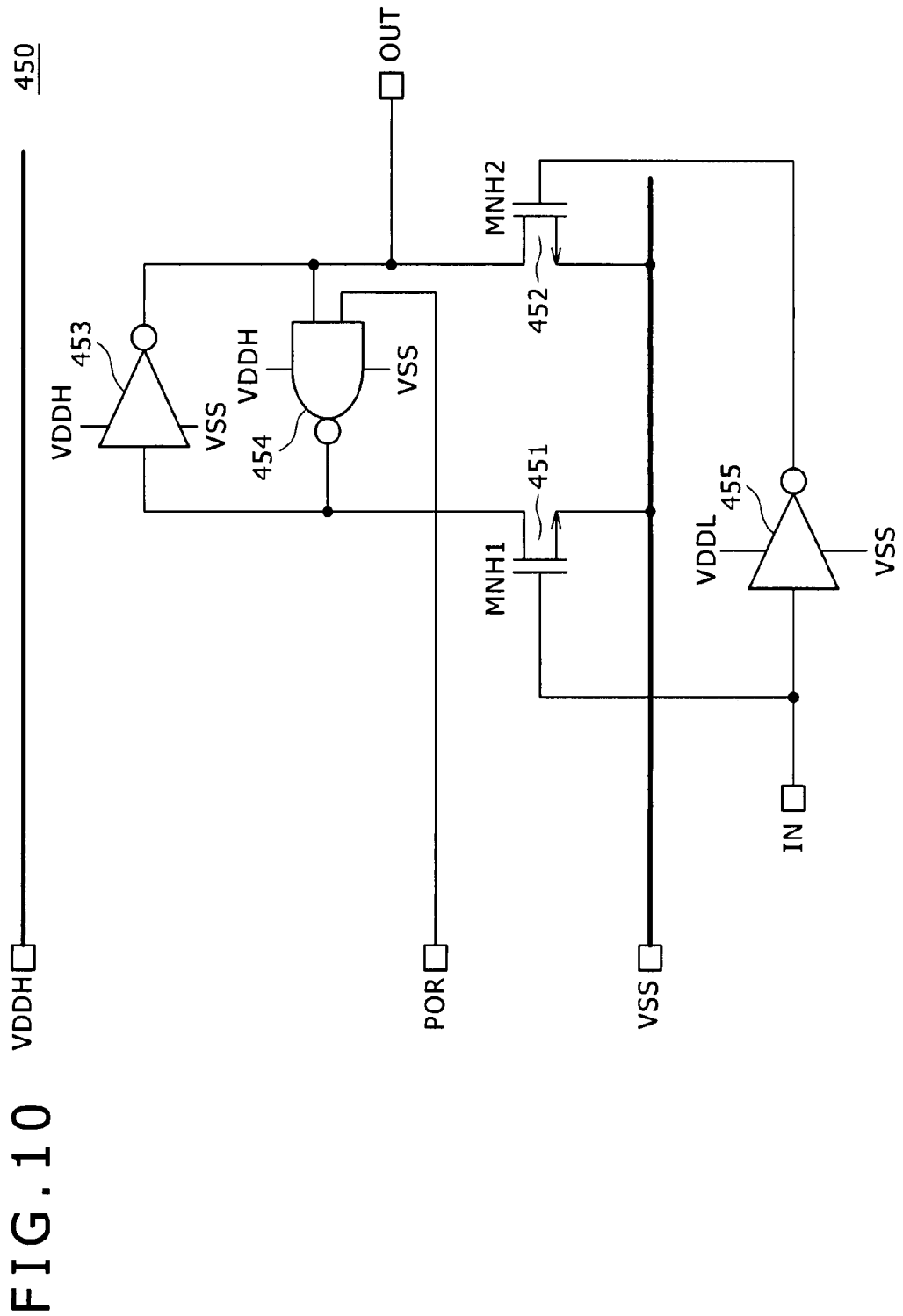
FIG. 10 shows a circuit configuration of a level conversion circuit according to a second existing example.

FIG. 8 shows an input-output device 350 according to a seventh embodiment of the present invention. This input-output device 350 includes level conversion circuits of a voltage lowering type and a voltage raising type and one bias circuit 360 having a voltage detecting function. In addition to this, the input-output device 350 may be formed with arbitrary numbers of level conversion circuits of the voltage lowering type and the voltage raising type, and these modifications are not limited in the present invention.

In the input-output device 350 in FIG. 8, the bias circuit 360 having the voltage detecting function is connected to a high voltage power supply VDDH and a low voltage power supply VDDL. The bias circuit 360 having the voltage detecting function outputs a POW_GOOD control signal and a bias (BIAS) voltage.

A POW_GOOD terminal is connected to voltage raising type level conversion circuits 370 and 380 and a voltage lowering type level conversion circuit 390. A bias (BIAS) terminal is connected to the voltage raising type level conversion circuits 370 and 380 and the voltage lowering type level conversion circuit 390. Details of connection and configuration of these circuits are the same as in FIGS. 1 and 3 to 7, and therefore description of the connection and configuration of the circuits will be omitted.

When the input-output device 350 starts and one of the high voltage power supply VDDH and the low voltage power supply VDDL starts first, the bias circuit 360 having the voltage detecting function operates to shut down the operation of the voltage raising type level conversion circuits 370 and 380 and the voltage lowering type level conversion circuit 390. A bias voltage is supplied at a starting time or after stabilization of power supply.

When the voltage of one of the high voltage power supply VDDH and the low voltage power supply VDDL rises first, and thereafter the other voltage becomes higher than a predetermined threshold value, the control signal output from the POW_GOOD terminal is set to an "L" level, for example the $V_{SS}$ level of a reference voltage power supply VSS, so that the voltage raising type level conversion circuits 370 and 380 and the voltage lowering type level conversion circuit 390 are set in an operating state.

When the high voltage power supply VDDH and the low voltage power supply VDDL are stabilized, the voltage raising type level conversion circuits 370 and 380 and the voltage lowering type level conversion circuit 390 make a transition to a normal operating state.

The voltage raising type level conversion circuits 370 and 380 convert input voltages (signals) from input terminals IN1 and IN2 which voltages have the logic amplitudes of the $V_{DDL}$ level and the $V_{SS}$ level into output signals having the logic amplitudes of the $V_{DDH}$ level and the $V_{SS}$ level.

On the other hand, the voltage lowering type level conversion circuit 390 converts an input voltage (signal) from an input terminal IN3 which voltage has the logic amplitudes of the $V_{DDH}$ level and the $V_{SS}$ level into an output signal having the logic amplitudes of the $V_{DDL}$ level and the $V_{SS}$ level.

In the above-described input-output device 350, the same bias circuit 360 having the voltage detecting function can be made common to all of the voltage raising type level conversion circuits 370 and 380 and the voltage lowering type level conversion circuit 390, and thus a plurality of level conversion circuits can be connected to the bias circuit 360 having the voltage detecting function as shown in FIG. 8.

Thus, the above-described level conversion circuits can perform level conversion dealing with a free power supply sequence. As a result, it is possible not only to shorten a design period for consideration of a power supply sequence but also to prevent unexpected problems related to a start because undetermined initial values and erroneous operations at a starting time can be avoided.

In addition, operation can be performed with a low power supply voltage lower than the threshold value of a high breakdown voltage MOS for the high voltage power supply VDDH. As a result, power efficiency is improved. A battery driving time can be lengthened.

Because high-speed operation can be performed without an increase in DC current, low power consumption can be achieved even when high-speed operation may be required.

Further, a bias circuit can be made common to level raising circuits and level lowering circuits. Therefore cost can be reduced as a result of a reduction in chip area and a reduction in the number of man-hours for design.

As described above, with the methods in the past, level conversion circuits of the voltage raising type and the voltage lowering type both have problems. However, according to the present invention, it is possible to realize lower power supply voltage and a free power supply sequence simultaneously in both cases of the voltage raising type and the voltage lowering type with a relatively simple configuration, and further achieve high-speed operation. In addition, the commonality of the BIAS circuit leads not only to a reduction in circuit scale but also to a decrease in cost.

It should be understood by those skilled in the art that various modifications, combinations, sub-combinations and alterations may occur depending on design requirements and other factors insofar as they are within the scope of the appended claims or the equivalents thereof.

What is claimed is:

1. A level conversion circuit comprising:
a controlling section supplied with a first power supply voltage and a second power supply voltage different from each other, said controlling section outputting a bias voltage, detecting rising of said first power supply voltage and said second power supply voltage, and outputting a control signal corresponding to a period from the rising of a power supply voltage to stabilization of the power supply voltage; and
a level converting section supplied with said control signal and said bias voltage, operation of the level converting section being set in one of a shutdown state and a normal operation state according to said control signal, and the level converting section converting level of an input signal and outputting a signal different in level from the input signal when the operation of the level converting section is set in the normal operation state.

2. The level conversion circuit as claimed in claim 1, wherein in order to operate said level conversion unit at a threshold value of a high breakdown voltage transistor or lower, a voltage obtained by adding a threshold voltage to a low voltage of said first power supply voltage and said second power supply voltage is applied to inputs of cascaded high breakdown voltage transistors, and output terminals of said cascaded high breakdown voltage transistors are limited to a low potential of said first power supply voltage and said second power supply voltage, whereby said level conversion unit performs low-voltage operation.

3. The level conversion circuit as claimed in claim 2, wherein said cascaded high breakdown voltage transistors are controlled by said control signal, and are shut down until said first power supply voltage and said second power supply voltage are stabilized.

4. The level conversion circuit as claimed in claim 3, wherein said level conversion circuit is a voltage raising type level conversion circuit, and reference terminals of said cascaded high breakdown voltage transistors are driven by a low breakdown voltage complementary metal oxide semiconductor buffer.

5. The level conversion circuit as claimed in claim 2, wherein said level conversion circuit is a voltage lowering type level conversion circuit, said cascaded high breakdown voltage transistors are supplied with the bias voltage from said controlling section, and output terminals of said cascaded high breakdown voltage transistors are clamped.

6. A level conversion circuit comprising:
a controlling section supplied with a first power supply voltage and a second power supply voltage different from each other, the controlling section outputting a bias voltage, detecting rising of said first power supply voltage and said second power supply voltage, and outputting a control signal corresponding to a period from the rising of a power supply voltage to stabilization of the power supply voltage;
a level converting section supplied with one of said first power supply voltage and said second power supply voltage, the level converting section converting level of an input signal and outputting an output signal of a voltage different in level from the input signal when the level converting section is in a normal operating state; and an operation controlling section supplied with said control signal and connected in series with or in parallel with said level converting section, the operation controlling section controlling said level converting section so as to set operation of said level converting section in one of a shutdown state and an operating state according to said control signal.

7. The level conversion circuit as claimed in claim 6, wherein said level conversion circuit has cascaded high breakdown voltage transistors, said bias voltage is supplied to inputs of said cascaded transistors, and output level of said cascaded high breakdown voltage transistors is clamped to a predetermined voltage.

8. The level conversion circuit as claimed in claim 7, wherein the output signal is latched by a latch circuit connected to output terminals of said cascaded high breakdown voltage transistors, and said operation controlling section is connected to at least one of outputs of said latch circuit.

9. The level conversion circuit as claimed in claim 8, wherein a low breakdown voltage transistor is connected to reference terminals of said cascaded high breakdown voltage transistors, and the input signal is supplied via said low breakdown voltage transistor.

10. The level conversion circuit as claimed in claim 7, wherein said operation controlling section has a transistor that is connected to said cascaded high breakdown voltage transistors and shuts down said cascaded high breakdown voltage transistors on a basis of said control signal.

11. The level conversion circuit as claimed in claim 7, wherein a complementary metal oxide semiconductor buffer is connected to reference terminals of said cascaded high breakdown voltage transistors of said level converting section.

12. The level conversion circuit as claimed in claim 7, wherein said operation controlling section has a transistor that is connected in parallel with said cascaded high breakdown voltage transistors and fixes an output value of said level converting section according to said control signal.

13. An input-output device comprising:
a controlling section supplied with a first power supply voltage and a second power supply voltage, the controlling section outputting a bias voltage, detecting rising of said first power supply voltage and said second power supply voltage at a starting time, and outputting a control signal for a period until said first power supply voltage and said second power supply voltage are stabilized;

at least one first level conversion circuit supplied with the control signal and the bias voltage from said controlling section, level converting operation of said at least one first level conversion circuit being shut down for the period until said first power supply voltage and said second power supply voltage are stabilized, and said at least one first level conversion circuit performing conversion from a first signal level to a second signal level when said first power supply voltage and said second power supply voltage are stabilized; and at least one second level conversion circuit supplied with the control signal and the bias voltage from said controlling section, level converting operation of said at least one second level conversion circuit being shut down for the period until said first power supply voltage and said second power supply voltage are stabilized, and said at least one second level conversion circuit performing conversion from said second signal level to said first signal level when said first power supply voltage and said second power supply voltage are stabilized.

14. The input-output device as claimed in claim 13, wherein said first and second level conversion circuits have cascaded high breakdown voltage transistors, and output levels of said cascaded transistors are clamped by the bias voltage output from said controlling section.

15. The input-output device as claimed in claim 13, wherein a transistor is connected in series with or in parallel with said first and second level conversion circuits, and operation of the transistor is controlled to be turned on or off according to the control signal output from said controlling section, whereby operation of said first and second level conversion circuits is controlled.

* * * * *